(12) United States Patent
Ishiwata

(10) Patent No.: US 10,355,037 B2
(45) Date of Patent: Jul. 16, 2019

(54) SOLID-STATE IMAGING DEVICE, METHOD OF MANUFACTURING SOLID-STATE IMAGING DEVICE, AND ELECTRONIC APPARATUS

(71) Applicant: Sony Semiconductor Solutions Corporation, Kanagawa (JP)

(72) Inventor: Hiroaki Ishiwata, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/204,176

(22) Filed: Nov. 29, 2018

(65) Prior Publication Data

US 2019/0096935 A1    Mar. 28, 2019

Related U.S. Application Data

(63) Continuation of application No. 16/031,345, filed on Jul. 10, 2018, now Pat. No. 10,177,184, which is a
(Continued)

(30) Foreign Application Priority Data

May 7, 2010   (JP) .................................. 2010-107265

(51) Int. Cl.
  *H04N 9/04*   (2006.01)
  *H04N 5/225*   (2006.01)
  (Continued)

(52) U.S. Cl.
  CPC .. *H01L 27/14612* (2013.01); *H01L 27/14603* (2013.01); *H01L 27/14605* (2013.01);
  (Continued)

(58) Field of Classification Search
  CPC ......... H01L 27/14641; H01L 27/14609; H01L 27/14603; H01L 27/14643;
  (Continued)

(56) References Cited

U.S. PATENT DOCUMENTS 6,956,605 B1   10/2005   Hashimoto
7,196,365 B2   3/2007   Yamamura
(Continued)

FOREIGN PATENT DOCUMENTS

JP   2600250   1/1997
JP   2000-059696   2/2000
(Continued)

OTHER PUBLICATIONS

Japanese Office Action issued in connection with related counterpart Japanese patent application No. JP 2010-107265 dated Feb. 25, 2014.
(Continued)

*Primary Examiner* — Michael S Osinski
(74) *Attorney, Agent, or Firm* — Dentons US LLP

(57) ABSTRACT

A solid-state imaging device including an imaging area where a plurality of unit pixels are disposed to capture a color image, wherein each of the unit pixels includes: a plurality of photoelectric conversion portions; a plurality of transfer gates, each of which is disposed in each of the photoelectric conversion portions to transfer signal charges from the photoelectric conversion portion; and a floating diffusion to which the signal charges are transferred from the plurality of the photoelectric conversion portions by the plurality of the transfer gates, wherein the plurality of the photoelectric conversion portions receive light of the same color to generate the signal charges, and wherein the signal
(Continued)

charges transferred from the plurality of the photoelectric conversion portions to the floating diffusion are added to be output as an electrical signal.

21 Claims, 20 Drawing Sheets

Related U.S. Application Data continuation of application No. 15/894,542, filed on Feb. 12, 2018, now Pat. No. 10,050,073, which is a continuation of application No. 15/465,084, filed on Mar. 21, 2017, now Pat. No. 9,923,005, which is a continuation of application No. 15/156,564, filed on May 17, 2016, now Pat. No. 9,653,499, which is a continuation of application No. 14/495,318, filed on Sep. 24, 2014, now Pat. No. 9,438,833, which is a continuation of application No. 13/085,676, filed on Apr. 13, 2011, now abandoned.

(51) Int. Cl.
| | |
|---|---|
| H04N 5/347 | (2011.01) |
| H04N 5/357 | (2011.01) |
| H04N 5/369 | (2011.01) |
| H01L 27/146 | (2006.01) |
| H04N 5/3745 | (2011.01) |

(52) U.S. Cl.
CPC .. *H01L 27/14621* (2013.01); *H01L 27/14627* (2013.01); *H01L 27/14641* (2013.01); *H01L 27/14645* (2013.01); *H01L 27/14685* (2013.01); *H04N 5/2253* (2013.01); *H04N 5/2254* (2013.01); *H04N 5/347* (2013.01); *H04N 5/357* (2013.01); *H04N 5/3696* (2013.01); *H04N 5/3745* (2013.01); *H04N 5/37457* (2013.01); *H04N 9/045* (2013.01)

(58) Field of Classification Search
CPC ......... H01L 27/14612; H01L 27/14621; H01L 27/14627; H01L 27/14645; H01L 27/14689; H04N 5/37457; H04N 5/335; H04N 5/378; H04N 5/3745; H04N 5/3559; H04N 5/3696; H04N 5/347; H04N 5/3454
USPC ............... 257/288–293; 250/208.1; 348/266, 348/272–283, 294–324, 332
See application file for complete search history.

(56) References Cited

U.S. PATENT DOCUMENTS

| | | | |
|---|---|---|---|
| 7,244,920 B2 | 7/2007 | Kim et al. |
| 7,436,010 B2 | 10/2008 | Mori et al. |
| 7,671,912 B2 | 3/2010 | Abe et al. |
| 7,705,901 B2 | 4/2010 | Kobayashi |
| 7,812,878 B2 | 10/2010 | Kudoh |
| 8,314,870 B2 | 11/2012 | Itonaga et al. |
| 8,525,906 B2 | 9/2013 | Ui |
| 8,797,434 B2 | 8/2014 | Lee et al. |
| 8,860,861 B2 | 10/2014 | Aoyama |
| 8,896,036 B2 | 11/2014 | Mabuchi et al. |
| 8,913,168 B2 | 12/2014 | Matsuda et al. |
| 8,947,567 B2 | 2/2015 | Suzuki et al. |
| 9,024,240 B2 | 5/2015 | Roy et al. |
| 9,270,915 B2 | 2/2016 | Kido et al. |
| 2003/0052252 A1 | 3/2003 | Sugiyama et al. |
| 2004/0159861 A1 | 8/2004 | Mori et al. |
| 2005/0179796 A1 | 8/2005 | Okita et al. |
| 2005/0248675 A1 | 11/2005 | Hashimoto et al. |
| 2006/0044439 A1 | 3/2006 | Hiyama et al. |
| 2006/0175536 A1 | 8/2006 | Kim et al. |
| 2006/0208285 A1 | 9/2006 | Inoue et al. |
| 2007/0035649 A1 | 2/2007 | McKee |
| 2007/0064129 A1 | 3/2007 | Suzuki |
| 2007/0164332 A1 | 7/2007 | Paik et al. |
| 2008/0062290 A1 | 3/2008 | Lahav et al. |
| 2008/0157012 A1 | 7/2008 | Tachino et al. |
| 2008/0180555 A1 | 7/2008 | Sato et al. |
| 2008/0210993 A1 | 9/2008 | Oshikubo et al. |
| 2008/0224913 A1 | 9/2008 | Suzuki et al. |
| 2009/0046189 A1 | 2/2009 | Yin et al. |
| 2009/0090845 A1 | 4/2009 | Yin et al. |
| 2009/0091648 A1 | 4/2009 | Lin et al. |
| 2009/0140304 A1 | 6/2009 | Kudoh |
| 2009/0167915 A1 | 7/2009 | Hirota et al. |
| 2010/0013969 A1 | 1/2010 | Ui |
| 2010/0097508 A1 | 4/2010 | Yanagita et al. |
| 2010/0118167 A1 | 5/2010 | Johnson |
| 2010/0134664 A1 | 6/2010 | Kuroda et al. |
| 2010/0177226 A1 | 7/2010 | Itonaga et al. |
| 2010/0225795 A1 | 9/2010 | Suzuki et al. |
| 2010/0238330 A1 | 9/2010 | Hirota |
| 2011/0019043 A1 | 1/2011 | Hamada |
| 2011/0019051 A1 | 1/2011 | Yin et al. |
| 2011/0073923 A1 | 3/2011 | Tatani et al. |
| 2011/0102620 A1 | 5/2011 | Sakano et al. |
| 2013/0049082 A1 | 2/2013 | Kato et al. |
| 2013/0229556 A1 | 9/2013 | Suzuki et al. |
| 2014/0152881 A1 | 6/2014 | Ishiwata et al. |

FOREIGN PATENT DOCUMENTS

| | | |
|---|---|---|
| JP | 2001-250931 | 9/2001 |
| JP | 2002-010276 | 1/2002 |
| JP | 2002-199284 | 7/2002 |
| JP | 2002-314058 | 10/2002 |
| JP | 2003-324189 | 11/2003 |
| JP | 2004-172950 | 6/2004 |
| JP | 2006-014107 | 1/2006 |
| JP | 2006-054276 | 2/2006 |
| JP | 2006-157953 | 6/2006 |
| JP | 2006-345330 | 12/2006 |
| JP | 2007-095792 | 4/2007 |
| JP | 2007-158109 | 6/2007 |
| JP | 2008-015754 | 1/2008 |
| JP | 2008-060198 | 3/2008 |
| JP | 2009-021919 | 1/2009 |
| JP | 2010-010487 | 1/2010 |
| JP | 2010-016114 | 1/2010 |
| WO | WO 2009/151585 | 12/2009 |
| WO | WO 2010/046982 | 4/2010 |

OTHER PUBLICATIONS

Japanese Office Action issued in connection with related counterpart Japanese patent application No. 2010-107265 dated Sep. 17, 2013.
Co-pending U.S. Appl. No. 16/204,194, filed Nov. 29, 2018.

FIG. 7
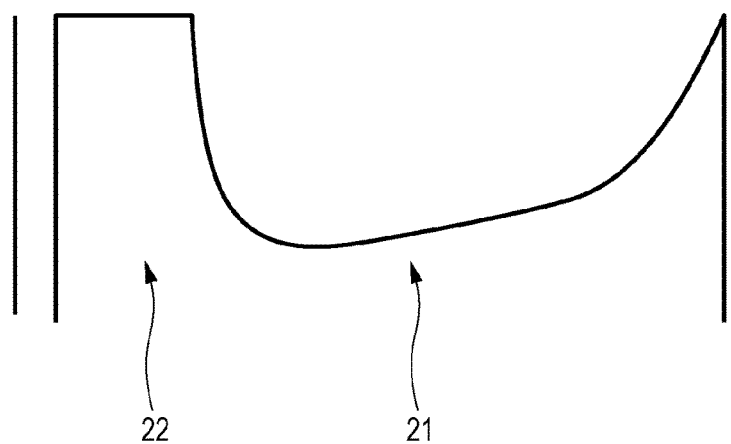
FIG. 8A
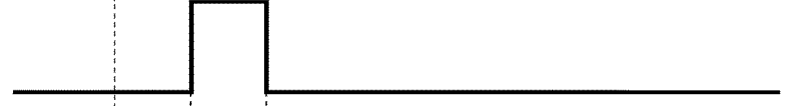
FIG. 8B
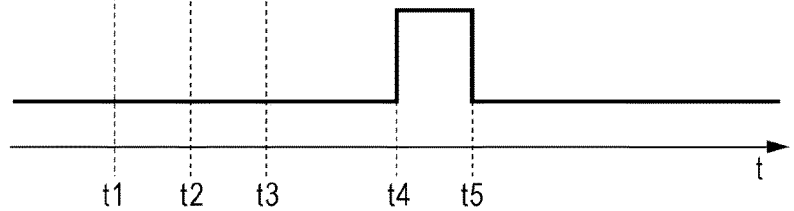
FIG. 8C

PRIOR ART FIG. 19A
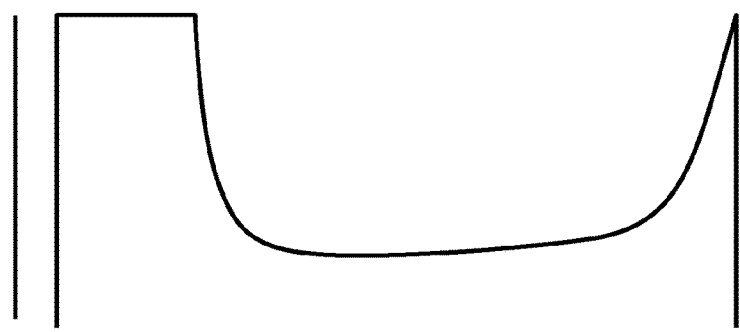
PRIOR ART FIG. 19B
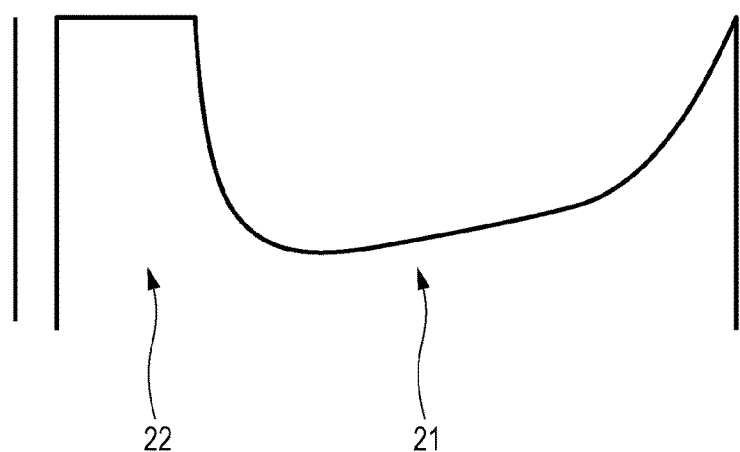

SOLID-STATE IMAGING DEVICE, METHOD OF MANUFACTURING SOLID-STATE IMAGING DEVICE, AND ELECTRONIC APPARATUS

RELATED APPLICATION DATA

This application is a continuation of U.S. patent application Ser. No. 16/031,345 filed Jul. 10, 2018, which is a continuation of U.S. patent application Ser. No. 15/894,542 filed Feb. 12, 2018, now U.S. Pat. No. 10,050,073 issued Aug. 14, 2018, which is a continuation of U.S. patent application Ser. No. 15/465,084 filed Mar. 21, 2017, now U.S. Pat. No. 9,923,005 issued Mar. 20, 2018, which is a continuation of U.S. patent application Ser. No. 15/156,564 filed May 17, 2016, now U.S. Pat. No. 9,653,499 issued May 16, 2017, which is a continuation of U.S. patent application Ser. No. 14/495,318 filed Sep. 24, 2014, now U.S. Pat. No. 9,438,833 issued Sep. 6, 2016, which is a continuation of U.S. patent application Ser. No. 13/085,676 filed Apr. 13, 2011, now abandoned, the entireties of which are incorporated herein by reference to the extent permitted by law. The present application claims the benefit of priority to Japanese Patent Application No. JP 2010-107265 filed on May 7, 2010 in the Japan Patent Office, the entirety of which is incorporated by reference herein to the extent permitted by law.

BACKGROUND OF THE INVENTION

1. Field of the Invention

The invention relates to a solid-state imaging device, a method of manufacturing the solid-state imaging device, and an electronic apparatus.

2. Description of the Related Art

An electronic apparatus such as a digital camera includes a solid-state imaging device. For example, the solid-state imaging device includes a CMOS (Complementary Metal Oxide Semiconductor) type image sensor and a CCD (Charge Coupled Device) type image sensor.

In the solid-state imaging device, an imaging area where a plurality of unit pixels are arrayed in a matrix shape is disposed in a semiconductor substrate. In each of the unit pixels, a photoelectric conversion portion is disposed. The photoelectric conversion portion is, for example, a photodiode and generates signal charges by receiving incident light incident through an externally attached optical system by a light-receiving plane and photoelectrically converting the light.

Among the solid-state imaging devices, in the CMOS type image sensor, the unit pixel is configured so that a plurality of transistors are included in addition to the photoelectric conversion portion. The plurality of the transistors are configured to read out the signal charges generated in the photoelectric conversion portion and to output an electrical signal to a signal line. For example, four transistors, that is, a transfer transistor, a reset transistor, an amplification transistor, and a selection transistor are disposed as the pixel transistors on the front surface of the semiconductor substrate. In addition, wire lines of electrically connecting these transistors are provided in the front surface of the semiconductor substrate.

There is a demand for solid-state imaging device may be desired to have high sensitivity. Particularly, in a digital camera used under lower luminance such as an endoscope camera and a monitoring camera, high sensitivity is necessary.

Therefore, it is considered that the high sensitivity is necessarily implemented by expanding an area of the light-receiving plane by increasing a pixel size.

In addition, there have been proposed technologies in which one set of pixel transistors is shared by a plurality of photoelectric conversion portions, so that high sensitivity is implemented by increasing an area occupied by the light-receiving plane in the unit pixel. For example, one set of the pixel transistors is shared by two or four photoelectric conversion portions (for example, refer to Japanese Unexamined Patent Application Publication Nos. 2004-172950, 2006-157953, and 2006-54276).

Additionally, there have been proposed techniques in which a microlens for focusing incident light on a light-receiving plane is disposed to each unit pixel, so that high sensitivity is implemented (for example, refer to Japanese Patent No. 2600250).

In addition, there have been proposed technologies in which a focusing efficiency is improved by measures such as optimization of the shape of an in-layer lens, reduction of the number of wire-line layers, or introduction of an optical waveguide, so that high sensitivity is implemented (for example, refer to Japanese Unexamined Patent Application Publication Nos. 2002-314058 and 2003-324189).

SUMMARY OF THE INVENTION

FIG. 18 is a diagram illustrating an array of unit pixels P in a CMOS type image sensor. In FIG. 18, a portion where two unit pixels P in each of the horizontal direction x and the vertical direction y are aligned to be adjacent to each other is illustrated.

As illustrated in FIG. 18, in each of the four unit pixels P, a photodiode 21 and a transfer transistor 22 are disposed. In addition, under the four unit pixels P, a transistor group constructed as a set of an amplification transistor 23, a selection transistor 24, and a reset transistor 25 is disposed. In other words, the four unit pixels P including the photodiode 21 and the transfer transistor 22 are configured so as to share the transistor group constructed as a set of the amplification transistor 23, the selection transistor 24, and the reset transistor 25.

More specifically, as illustrated in FIG. 18, the two photodiodes 21 are aligned in the vertical direction y. In addition, the transfer gates 22G of the two transfer transistors 22 are disposed so as to be aligned in the vertical direction y between the two photodiodes 21 aligned in the vertical direction y. In addition, between the two transfer gates 22G aligned in the vertical direction y, the floating diffusion FD is disposed.

In addition, as illustrated in FIG. 18, sets constructed with the two photodiodes 21, the two transfer gates 22G, and the floating diffusion FD aligned in the vertical direction y are disposed so as to be aligned in the horizontal direction x. Although not shown, the floating diffusions FD aligned in the horizontal direction x are electrically connected to each other, and the floating diffusions FD are connected to the gate of the amplification transistor 23.

In addition, as illustrated in FIG. 18, in each unit pixel P, the microlens ML and the color filter CF are disposed, so that the incident light incident sequentially through the microlens ML and the color filter CF is received by the photodiode 21.

The color filter CF includes a red filter layer CFR, a green filter layer CFG, and a blue filter layer CFB. The red filter layer CFR, the green filter layer CFG, and the blue filter layer CFB are adjacent to each other, and one thereof is disposed corresponding to each of the unit pixels P.

Herein, as illustrated in FIG. 18, the red filter layer CFR, the green filter layer CFG, and the blue filter layer CFB are disposed so as to be aligned in a Bayer array.

FIGS. 19A and 19B are conceptual diagrams illustrating a potential in the unit pixel P in the CMOS type image sensor. In FIGS. 19A and 19B, the potentials in a portion taken along line XIX-XIX of FIG. 18 are illustrated.

As illustrated in FIG. 19A, in the case where the electric field gradient in the photodiode 21 is small, there may be problems in that a transfer time of the signal charges is increased and some signal charges are not transferred but remain, so that an after image occurs.

Therefore, as illustrated in FIG. 19B, the occurrence of the problem is suppressed by increasing the electric field gradient in the photodiode 21 so that the signal charges are moved to the side of the transfer transistor 22. In this case, for example, an ion injection process is added, so that the photodiode 21 is formed as illustrated in the above-described potential diagram.

FIGS. 20 and 21 are diagrams illustrating behaviors of incident light incident on the unit pixel P of the CMOS type image sensor. Herein, FIG. 20 illustrates a behavior in the case where the main light beams H21 are incident on upper pixels PU disposed in the upper end portion in the imaging area where a plurality of the unit pixels P are arrayed. In addition, FIG. 21 illustrates a behavior in the case where the main light beams H22 are incident on lower pixels PL disposed in the lower end portion in the imaging area where a plurality of the unit pixels P are arrayed.

As illustrated in FIGS. 20 and 21, the photodiode 21 and the floating diffusion FD are disposed in an upper layer portion of the semiconductor substrate 101. In addition, the transfer gate 22G constituting the transfer transistor 22 is disposed through a gate insulating film (not shown) on the surface of the semiconductor substrate 101, on which the main light beams H21 and H22 are incident. The transfer gate 22G is formed with, for example, a conductive light-blocking material such as polysilicon.

As illustrated in FIGS. 20 and 21, in the upper end portion or the lower end portion of the imaging area, the main light beams H21 and H22 are not incident in the direction z perpendicular to the surface of the semiconductor substrate 101 but they are incident in the direction slanted with respect to the direction z (refer to FIGS. 1 and 2 and refer to FIG. 3 or the like in Japanese Patent No. 2600250). Herein, in each unit pixel P, since the main light beams H21 and H22 are incident through color filters, the main light beams H21 and H22 are incident on the photodiode 21 as colored light such as red light or green light.

Therefore, as illustrated in FIG. 20, in the upper pixel PU located in the upper end portion of the imaging area, a portion of the green light among the main light beams H21 is blocked by the transfer gate 22G before the portion of the green light is incident on the photodiode 21. On the other hand, in the adjacent unit pixel P, the red light among the main light beams H21 is not blocked by the transfer gate 22G before the red light is incident on the photodiode 21. In other words, vignetting of the green light occurs, but vignetting of the red light does not occur.

On the contrary, as illustrated in FIG. 21, in the lower pixel PL located in the lower end portion of the imaging area, a portion of the red light among the main light beams H22 is blocked by the transfer gate 22G before the portion of the red light is incident on the photodiode 21. On the other hand, in the adjacent unit pixel P, the green light among the main light beam H21 is not blocked by the transfer gate 22G before the green light is incident on the photodiode 21. In other words, unlike the upper end portion of the imaging area, in the lower end portion of the imaging area, vignetting of the green light does not occur, but vignetting of the red light occurs.

In this manner, in the end portion of the imaging area, since vignetting ratios are different among the colors, there may be a problem in that the color shading occurs, so that the image quality of the color image is deteriorated.

Particularly, in a small-sized electronic apparatus such as a capsule endoscope a portable camera, there may be problems in that the considerable color shading occurs, so that the image quality of the color image is deteriorated. In other words, in the aforementioned small-sized electronic apparatus, in many cases, the volume for mounting an externally-attached lens module is necessarily reduced, and thus, the maximum main light beam angle of the lens is configured to be large for the small thickness of the apparatus, so that the considerable color shading occurs.

Besides, in the case where the pixel size is increased in order to improve the sensitivity, there are problems in that, since the distance between the center of the photodiode 21 and the transfer transistor 22 is increased, the charge transfer efficiency is decreased, so that the afterimage occurs.

In this manner, in some cases, in the solid-state imaging device, it is difficult to simultaneously obtain prevention of the occurrence of the color shading, the afterimage, or the like and improvement of the sensitivity. As a result, it is difficult to improve the image quality of the captured image.

Therefore, it is desirable to provide a solid-state imaging device capable of improving an image quality of a captured image, a method of manufacturing the solid-state imaging device, and an electronic apparatus.

According to an embodiment of the invention, there is provided a solid-state imaging device including an imaging area where a plurality of unit pixels are disposed to capture a color image, wherein each of the unit pixels includes: a plurality of photoelectric conversion portions; a plurality of transfer gates, each of which is disposed in each of the photoelectric conversion portions to transfer signal charges from the photoelectric conversion portion; and a floating diffusion to which the signal charges are transferred from the plurality of the photoelectric conversion portions by the plurality of the transfer gates, wherein the plurality of the photoelectric conversion portions receive light of the same color to generate the signal charges, and wherein the signal charges transferred from the plurality of the photoelectric conversion portions to the floating diffusion are added to be output as an electrical signal.

Preferably, the unit pixel is configured so that the floating diffusions are interposed by the plurality of the photoelectric conversion portions and so that the plurality of the transfer gates are disposed between the plurality of the photoelectric conversion portions and the floating diffusions.

Preferably, a plurality of the unit pixels are arrayed in a first direction and a second direction perpendicular to the first direction in the imaging area; the floating diffusions are disposed so as to be interposed by the plurality of the photoelectric conversion portions in the first direction; and the plurality of the transfer gates are disposed so as to be interposed between the plurality of the photoelectric conversion portions and the floating diffusions in the first direction.

Preferably, a plurality of the unit pixels are arrayed in a first direction and a second direction perpendicular to the first direction in the imaging area; the floating diffusions are disposed so as to be interposed by the plurality of the photoelectric conversion portions in a direction slanted with respect to the first direction and the second direction; and the plurality of the transfer gates are disposed so as to be interposed between the plurality of the photoelectric conversion portions and the floating diffusions in the direction slanted with respect to the first direction and the second direction.

Preferably, the plurality of the photoelectric conversion portions are arrayed in the unit pixel so that the same number of the photoelectric conversion portions are aligned in each of the first direction and second direction.

Preferably, the plurality of the photoelectric conversion portions are arrayed so that an even number of the photoelectric conversion portions are aligned in each of the first direction and the second direction.

Preferably, the plurality of the photoelectric conversion portions are arrayed so that multiples of the four photoelectric conversion portions are aligned in each of the first direction and the second direction.

Preferably, the unit pixel includes: an amplification transistor of which the gate is electrically connected to the floating diffusion; and a vertical signal line which outputs a signal obtained from the signal charges transferred to the floating diffusion, wherein a plurality of the amplification transistors are disposed in the unit pixel, wherein a plurality of the vertical signal lines are disposed, and the plurality of the vertical signal lines are electrically connected to each other, and wherein the signal output from the plurality of the vertical signal lines are smoothed.

Preferably, the unit pixel includes: an amplification transistor of which the gate is electrically connected to the floating diffusion; and a vertical signal line which outputs a signal obtained from the signal charges transferred to the floating diffusion, wherein a plurality of the amplification transistors are disposed in the unit pixel, and the sources of the plurality of the amplification transistors are electrically connected to a common vertical signal line.

Preferably, the unit pixel includes a microlens which focuses light on the photoelectric conversion portion, and a plurality of the microlenses are disposed corresponding to the plurality of the photoelectric conversion portions.

Preferably, the unit pixel includes an optical waveguide which guides light to the photoelectric conversion portion, and a plurality of the optical waveguides are disposed corresponding to the plurality of the photoelectric conversion portions.

According to another embodiment of the invention, there is provided a method of manufacturing a solid-state imaging device including the step of forming the solid-state imaging device by disposing a plurality of unit pixels in an imaging area which captures a color image, wherein the step of forming the unit pixel includes the steps of: forming a plurality of photoelectric conversion portions which receive light of the same color to generate signal charges; disposing a plurality of transfer gates, which transfer the signal charges from the photoelectric conversion portions, in the plurality of the photoelectric conversion portions; and forming a floating diffusion to which signal charges from the plurality of the photoelectric conversion portions are transferred through the plurality of the transfer gates to be added.

According to still another embodiment of the invention, there is provided an electronic apparatus having a solid-state imaging device including an imaging area where a plurality of unit pixels are disposed to capture a color image, wherein each of the unit pixels includes: a plurality of photoelectric conversion portions; a plurality of transfer gates, each of which is disposed in each of the photoelectric conversion portions to transfer signal charges from the photoelectric conversion portion; and a floating diffusion to which the signal charges are transferred from the plurality of the photoelectric conversion portions by the plurality of the transfer gates, wherein the plurality of the photoelectric conversion portions receive light of the same color to generate the signal charges, and wherein the signal charges transferred from the plurality of the photoelectric conversion portions to the floating diffusion are added to be output as an electrical signal.

In the invention, a plurality of unit pixels are disposed so as to capture a color image by an imaging area. Herein, a plurality of photoelectric conversion portions are included in the unit pixel. In addition, a plurality of transfer gates which transfer signal charges from each of the photoelectric conversion portions are included in the unit pixel. In addition, a floating diffusion to which the signal charges are transferred from the plurality of the photoelectric conversion portions by the plurality of the transfer gates is included in the unit pixel. In the invention, the plurality of the photoelectric conversion portions are formed so as to receive light of the same color and to generate the signal charges. In addition, the signal charges transferred from the plurality of the photoelectric conversion portions to the floating diffusion are added to be output as an electrical signal.

According to the invention, it is possible to provide a solid-state imaging device capable of improving an image quality of a captured image, a method of manufacturing the solid-state imaging device, and an electronic apparatus.

BRIEF DESCRIPTION OF THE DRAWINGS

FIG. 7 is a conceptual diagram illustrating a potential in a unit pixel according to the first embodiment of the invention.

FIGS. 8A to 8C are timing charts illustrating pulse signals supplied to portions of the unit pixel when a signal is read out from the unit pixel according to the first embodiment of the invention.

FIGS. 19A and 19B are conceptual diagrams illustrating a potential in the unit pixel in the CMOS type image sensor.

DESCRIPTION OF THE PREFERRED EMBODIMENTS

Hereinafter, embodiments of the invention will be described with reference to the drawings.

In addition, the description will be made in the following order.

1. First Embodiment (a case where a unit pixel includes 4 PDs)
2. Second Embodiment (a case where there is an optical waveguide)
3. Third Embodiment (a case where a unit pixel includes 16 PDs)
4. Fourth Embodiment (a case where a unit pixel includes 16 PDs)
5. Others

1. First Embodiment (A) Configuration of Apparatus
(A-1) Configuration of Main Components of Camera FIG. 1 is a configurational diagram illustrating a configuration of a camera 40 according to a first embodiment of the invention.

Figure 1:
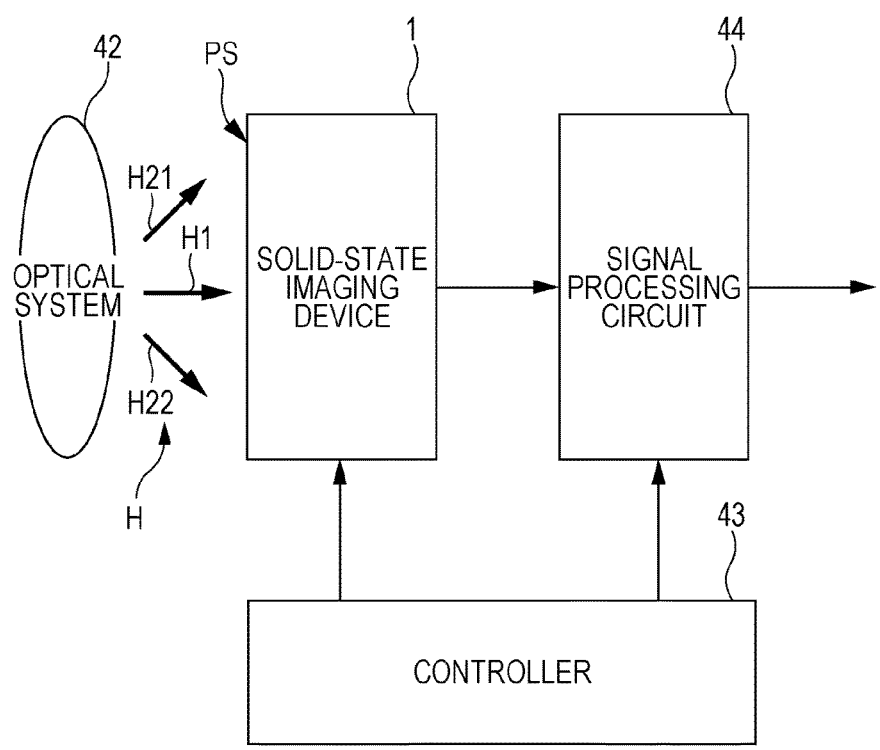
FIG. 1 is a configurational diagram illustrating a configuration of a camera according to a first embodiment of the invention.

As illustrated in FIG. 1, the camera 40 is an electronic apparatus and includes a solid-state imaging device 1, an optical system 42, a controller 43, and a signal processing circuit 44.

The solid-state imaging device 1 generates signal charges by receiving incident light H incident as a subject image through the optical system 42 by an imaging plane PS and photoelectrically converting the light. In addition, the solid-state imaging device 1 is driven based on a control signal output from the controller 43 to read out the signal charges and output raw data.

In the embodiment, as illustrated in FIG. 1, in the solid-state imaging device 1, main light beams H1 emitted from the optical system 42 are incident on the central portion of the imaging plane PS at an angle perpendicular to the imaging plane PS. On the other hand, main light beams H21 and H22 are incident on the peripheral portion of the imaging plane PS at an angle slanted with respect to the direction perpendicular to the imaging plane PS of the solid-state imaging device 1. Herein, the main light beams H21 and H22 are slantingly incident on the imaging plane PS from the center of the imaging plane PS toward the periphery thereof.

The optical system 42 includes optical elements such as a focusing lens or an aperture. The optical system 42 is disposed so that incident light according to a subject image is focused on the imaging plane PS of the solid-state imaging device 1.

In the embodiment, the optical system 42 is installed so that the optical axis corresponds to the center of the imaging plane PS of the solid-state imaging device 1. Therefore, as illustrated in FIG. 1, the optical system 42 emits the main light beams H1 to the central portion of the imaging plane PS of the solid-state imaging device 1 at the angle perpendicular to the imaging plane PS. On the other hand, the optical system 42 emits the main light beams H21 and H22 to the peripheral portion of the imaging plane PS at an angle slanted with respect to the direction perpendicular to the imaging plane PS. This is caused by finiteness of an exit pupil distance formed by an aperture or the like.

The controller 43 outputs various control signals to the solid-state imaging device 1 and the signal processing circuit 44 to control and drive the solid-state imaging device 1 and the signal processing circuit 44.

The signal processing circuit 44 is configured to generate a digital image with respect to the subject image by performing a signal process on raw data output from the solid-state imaging device 1.

(A-2) Main Components of Solid-State Imaging Device

A whole configuration of the solid-state imaging device 1 is described.

Figure 2:
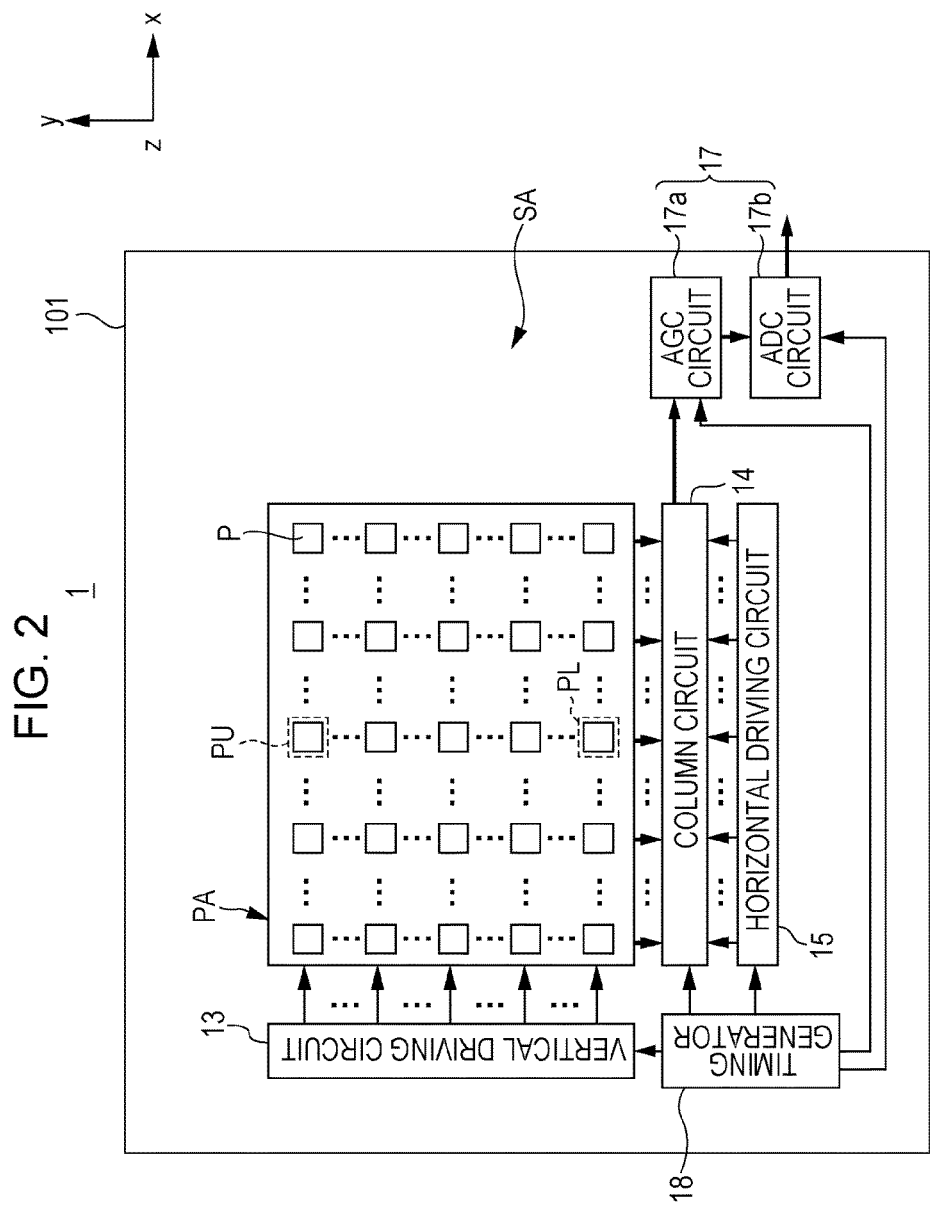
FIG. 2 is a diagram illustrating a whole configuration of a solid-state imaging device according to the first embodiment of the invention.

FIG. 2 is a diagram illustrating a whole configuration of the solid-state imaging device 1 according to the first embodiment of the invention. In FIG. 2, an upper surface is illustrated.

The solid-state imaging device 1 according to the embodiment is a CMOS type image sensor and includes a semiconductor substrate 101 as illustrated in FIG. 2. The semiconductor substrate 101 is, for example, a semiconductor substrate made of silicon and, as illustrated in FIG. 2, an imaging area PA and a peripheral area SA are disposed in a surface of the semiconductor substrate 101.

As illustrated in FIG. 2, the imaging area PA has a quadrangular shape, in which a plurality of the unit pixels P are disposed in each of the horizontal direction x and the vertical direction y. In other words, the unit pixels P are aligned in a matrix shape. In addition, the imaging area PA is disposed so that the center thereof corresponds to the optical axis of the optical system 42 illustrated in FIG. 1.

The imaging area PA corresponds to the imaging plane PS illustrated in FIG. 1. Therefore, as described above, in the unit pixel P disposed at the central portion of the imaging area PA, the main light beams (H1 of FIG. 1) are incident at an angle perpendicular to the plane of the imaging area PA.

On the other hand, in the unit pixel P (for example, the upper pixel PU or the lower pixel PL) disposed in the peripheral portion of the imaging area PA, the main light beam (H21 or H22 of FIG. 1) is incident at an angle slanted with respect to the direction perpendicular to the plane of the imaging area PA.

As illustrated in FIG. 2, the peripheral area SA is located in the periphery of the imaging area PA. In addition, peripheral circuits are disposed in the peripheral area SA.

More specifically, as illustrated in FIG. 2, a vertical driving circuit 13, a column circuit 14, a horizontal driving circuit 15, an external output circuit 17, and a timing generator (TG) 18 are disposed as the peripheral circuits.

As illustrated in FIG. 2, the vertical driving circuit 13 is configured to be disposed at a side portion of the imaging area PA in the peripheral area SA so as to select and drive the unit pixels P of the imaging area PA in units of a row of the unit pixels P.

As illustrated in FIG. 2, the column circuit 14 is configured to be disposed in the lower end portion of the imaging area PA in the peripheral area SA so as to perform a signal process on the signal output from the unit pixels P in units of a column of the unit pixels P. Herein, the column circuit 14 includes a CDS (Correlated Double Sampling) circuit (not shown) to perform a signal process of removing fixed pattern noise.

As illustrated in FIG. 2, the horizontal driving circuit 15 is electrically connected to the column circuit 14. The horizontal driving circuit 15 includes, for example, shift registers to sequentially output signals stored in units of a column of the unit pixels P in the column circuit 14 to the external output circuit 17.

As illustrated in FIG. 2, the external output circuit 17 is electrically connected to the column circuit 14. The external output circuit 17 performs a signal process on the signal output from the column circuit 14 and outputs the processed signal to an external portion. The external output circuit 17 includes an AGC (Automatic Gain Control) circuit 17a and an ADC circuit 17b. In the external output circuit 17, the AGC circuit 17a applies a gain to a signal, and after that, the ADC circuit 17b converts an analog signal to a digital signal to output the digital signal to an external portion.

As illustrated in FIG. 2, the timing generator 18 is electrically connected to the vertical driving circuit 13, the column circuit 14, the horizontal driving circuit 15, and the external output circuit 17. The timing generator 18 generates various timing signals and outputs the timing signals to the vertical driving circuit 13, the column circuit 14, the horizontal driving circuit 15, and the external output circuit 17 to perform driving controls of the portions.

(A-3) Detailed Configuration of Solid-State Imaging Device

A detailed configuration of the solid-state imaging device 1 according to the embodiment is described.

FIGS. 3 to 6 are diagrams illustrating main components of the solid-state imaging device 1 according to the first embodiment of the invention.

Figure 3:
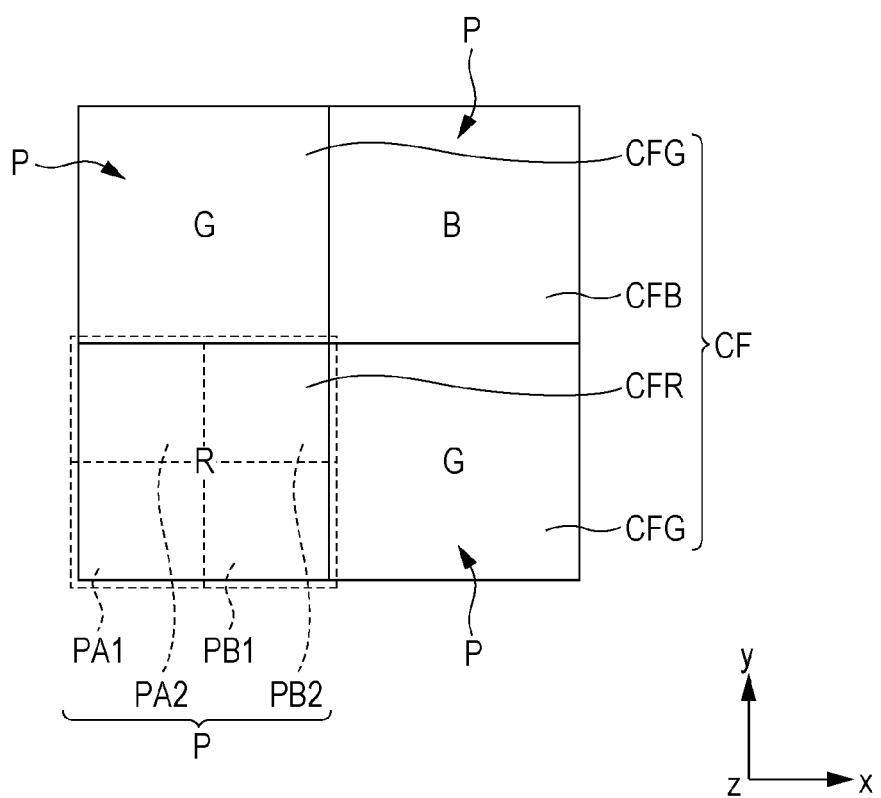
FIG. 3 is a diagram illustrating main components of the solid-state imaging device according to the first embodiment of the invention.

Herein, FIG. 3 illustrates an upper surface of an imaging area PA where a plurality of the unit pixels P are arrayed in the solid-state imaging device 1. In FIG. 3 a portion where two unit pixels P in each of the horizontal direction x and the vertical direction y are aligned to be adjacent to each other is exemplarily illustrated.

Figure 4:
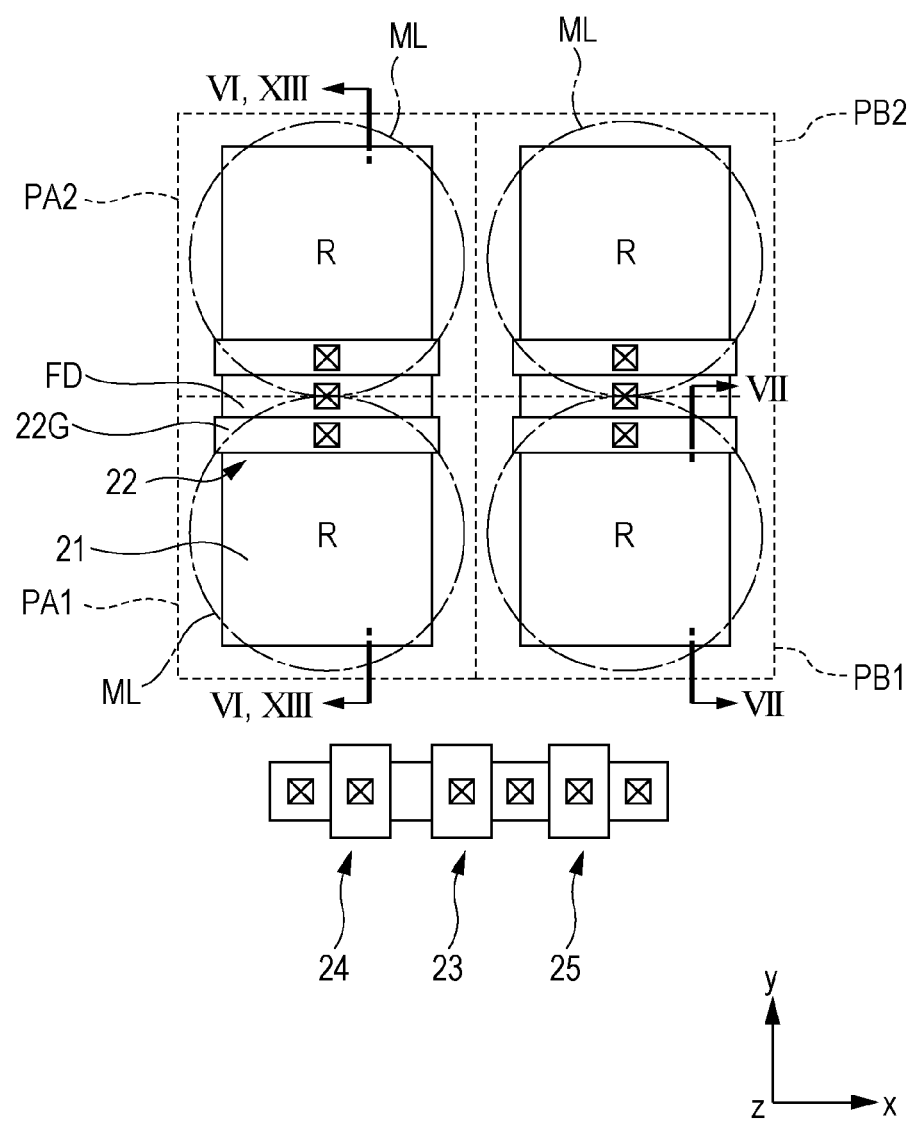
FIG. 4 is a diagram illustrating main components of the solid-state imaging device according to the first embodiment of the invention.

In addition, FIG. 4 illustrates an upper surface of one unit pixel P. In FIG. 4, the upper surface of the unit pixel P (red pixel) where the red filter layer CFR in FIG. 3 is disposed is exemplarily illustrated. In addition, in FIG. 3, the unit pixel P (green pixel) where the green filter layer CFG is disposed and the unit pixel P (blue pixel) where the blue filter layer CFB is disposed also have the same configuration as the unit pixel P (red pixel) where the red filter layer CFR is disposed.

Figure 5:
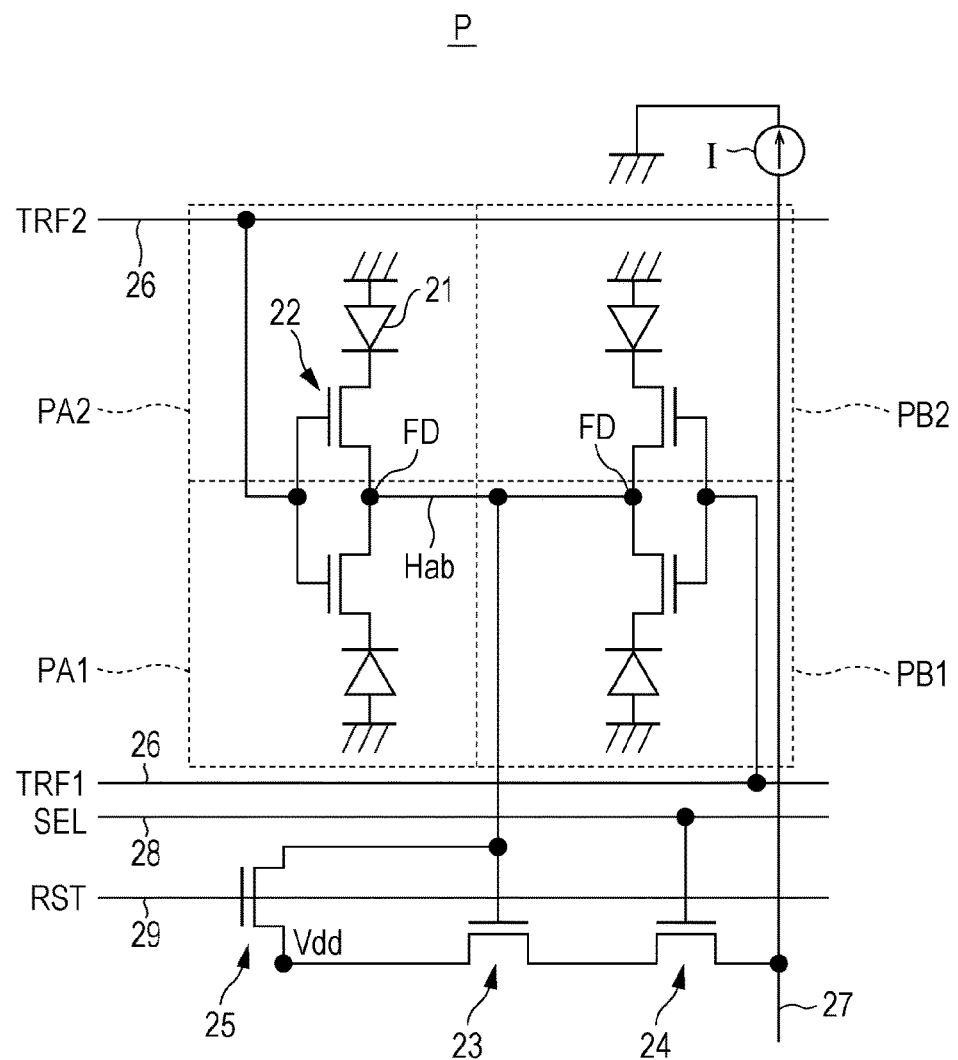
FIG. 5 is a diagram illustrating main components of the solid-state imaging device according to the first embodiment of the invention.

In addition, FIG. 5 illustrates a circuit configuration of one unit pixel P. In FIG. 5, similarly to FIG. 4, a circuit configuration of the unit pixel P (red pixel) where the red filter layer CFR in FIG. 3 is disposed is exemplarily illustrated. In addition, the green pixel and the blue pixel also have the same configuration as the red pixel.

Figure 6:
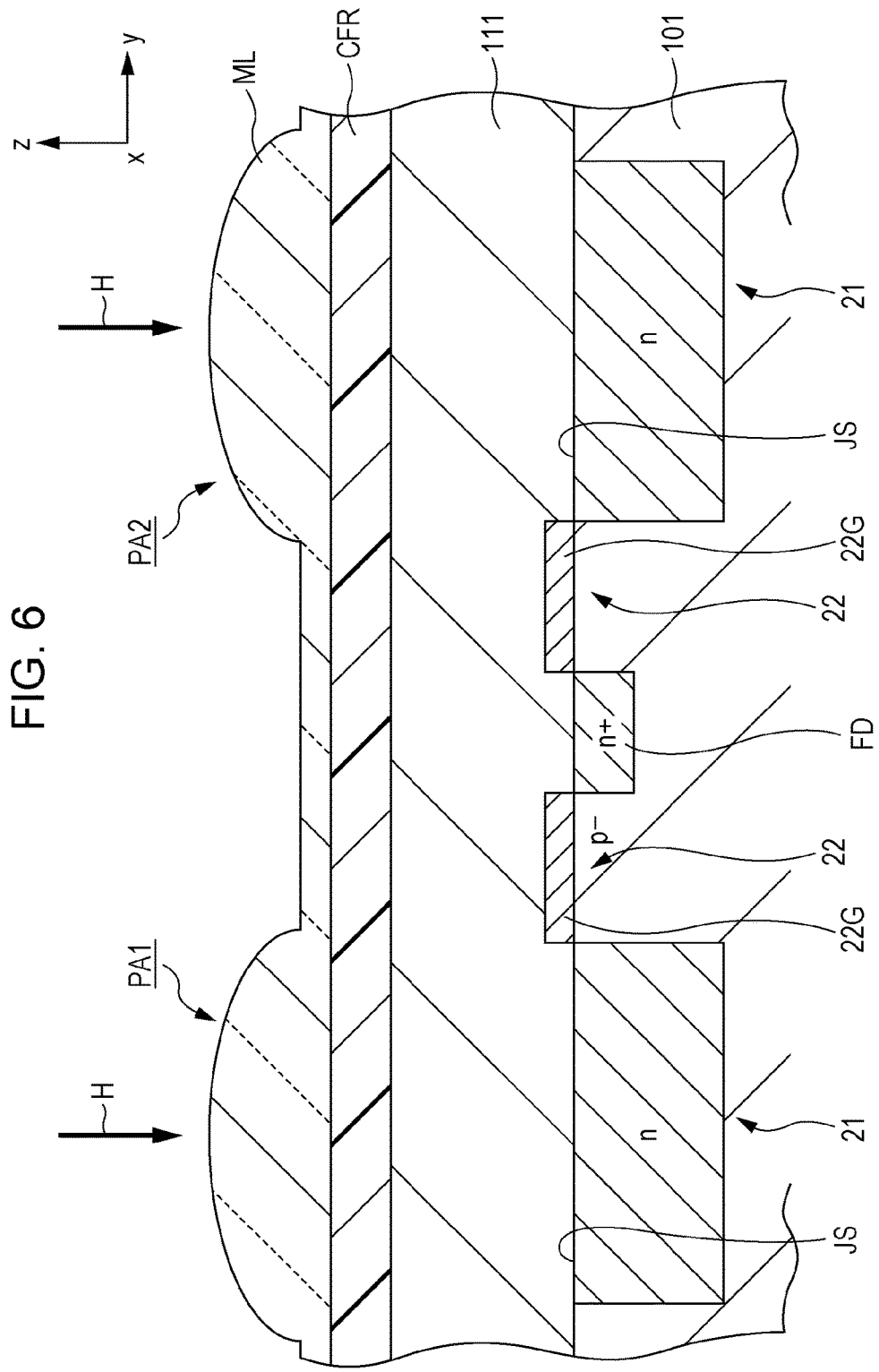
FIG. 6 is a diagram illustrating main components of the solid-state imaging device according to the first embodiment of the invention.

In addition, FIG. 6 illustrates a cross section of one unit pixel P. In FIG. 6, a cross section of a portion taken along line VI-VI of FIG. 4 is illustrated.

(A-3-1) Array of Unit Pixels

As illustrated in FIG. 3, in the solid-state imaging device 1, a plurality of the unit pixels P are disposed in each of the horizontal direction x and the vertical direction y.

As illustrated in FIG. 3, in the solid-state imaging device 1, in order to capture a color image, each color filter CF is disposed in each of the unit pixels P. The color filter CF includes a red filter layer CFR, a green filter layer CFG, and a blue filter layer CFB. The red filter layer CFR, the green filter layer CFG, and the blue filter layer CFB are adjacent to each other, and one thereof is disposed corresponding to each of the unit pixels P.

Herein, as illustrated in FIG. 3, the red filter layer CFR, the green filter layer CFG, and the blue filter layer CFB are disposed to be aligned in a Bayer array. In other words, a plurality of the green filter layers CFG are disposed to be aligned in the diagonal direction so as to be in a checkered shape. In addition, the red filter layers CFR and the blue filter layers CFB are disposed to be aligned in the diagonal direction of the plurality of the green filter layers CFG.

In addition, although not shown, a light blocking portion (not shown) is disposed in the periphery of each of the red filter layer CFR, the green filter layer CFG, and the blue filter layer CFB so as to partition the unit pixel P.

In the embodiment, as illustrated in FIG. 3, each unit pixel P includes a plurality of the imaging portions PA1, PA2, PB1, and PB2. In the embodiment, the unit pixel P is configured to include four imaging portions PA1, PA2, PB1, and PB2.

(A-3-2) Each Unit Pixel

As illustrated in FIGS. 4 and 5, in the unit pixel P, a plurality of the imaging portions PA1, PA2, PB1, and PB2 are arrayed on the imaging plane (xy plane).

The plurality of the imaging portions PA1, PA2, PB1, and PB2 are aligned on the imaging plane (xy plane) in the horizontal direction x and the vertical direction y perpendicular to the horizontal direction x.

As illustrated in FIGS. 4 and 5, in each of the imaging portions PA1, PA2, PB1, and PB2, a photodiode 21 and a transfer transistor 22 are disposed. In addition, under the plurality of the imaging portions PA1, PA2, PB1, and PB2, a transistor group constructed as a set of an amplification transistor 23, a selection transistor 24, and a reset transistor 25 is disposed. In other words, the unit pixel P is constructed so that the four imaging portions PA1, PA2, PB1, and PB2, each of which includes the photodiode 21 and the transfer transistor 22, share the set of the amplification transistor 23, the selection transistor 24, and the reset transistor 25.

More specifically, as illustrated in FIG. 4, in the area partitioned into the two imaging portions PA1 and PA2 aligned in the vertical direction y, the two photodiodes 21 are disposed so as to be aligned in the vertical direction y in each of the imaging portions PA1 and PA2. In addition, between the photodiodes 21, the transfer gates 22G of the two transfer transistors 22 are disposed so as to be aligned in the vertical direction y in each of the imaging portions PA1 and PA2. In addition, the floating diffusion FD is disposed between the two transfer gates 22G aligned in the vertical direction y.

In addition, as illustrated in FIG. 4, the two imaging portions PB1 and PB2 aligned in the vertical direction y are disposed in the same configuration as that of the two imaging portions PA1 and PA2. In other words, sets constructed with the two photodiodes 21, the two transfer gates 22G, and the floating diffusion FD aligned in the vertical direction y are disposed so as to be aligned in the horizontal direction x.

Herein, as illustrated in FIG. 5, the floating diffusions FD aligned in the horizontal direction x are electrically connected to each other through a wire line Hab, and the floating diffusions FD are connected to the gate of the amplification transistor 23.

Besides, as illustrated in FIGS. 4 and 6, in the unit pixel P, a microlens ML is disposed.

As illustrated in FIG. 6, in the unit pixel P, the wire-line layer 111 and the color filter CF are disposed between the microlens ML and the photodiode 21, so that the incident light H incident sequentially through these components is received by the photodiode 21.

In addition, as illustrated in FIG. 5, in the unit pixel P, the transfer transistor 22 transfers the signal charges generated by the photodiode 21 to the floating diffusions FD to output an electrical signal through the amplification transistor 23 or the like to the vertical signal line 27.

The detail configurations of the components constituting the unit pixel P are sequentially described.

(a) Photodiode

As illustrated in FIG. 4, in the unit pixel P, a plurality of the photodiodes 21 are disposed on the imaging plane (xy plane). The even number of the photodiodes 21 are disposed to be aligned in each of the horizontal direction x and the vertical direction y to correspond to the array of the imaging portions PA1, PA2, PB1, and PB2. For example, the photodiode 21 is disposed in each of the imaging portions PA1, PA2, PB1, and PB2, of which the size is in a range of from 1 to 2 μm. In other words, the photodiodes 21 are disposed so that the two photodiodes 21 are aligned in an equal interval in each of the horizontal direction x and the vertical direction y.

As illustrated in FIG. 6, the photodiodes 21 are disposed in the semiconductor substrate 101.

The photodiode 21 is configured so as to generate and accumulate the signal charges by receiving the incident light H incident as a subject image with the light-receiving plane JS and photoelectrically converting the incident light H.

For example, the photodiode 21 is configured so that an n-type charge accumulation area (not shown) is formed in a p well (not shown) disposed in the semiconductor substrate 101 which is an n-type silicon semiconductor. In addition, furthermore, in order to suppress a dark current, a p-type accumulation layer (not shown) is configured to be included on the front surface of the semiconductor substrate 101. In other words, the photodiode 21 is formed in a so-called HAD (Hall Accumulated Diode) structure.

In addition, as illustrated in FIG. 5, each of the photodiodes 21 is configured so that the accumulated signal charges are transferred to the floating diffusion FD by the transfer transistor 22.

In the embodiment, as illustrated in FIGS. 4 and 5, the unit pixel P includes the four photodiodes 21, and the four transfer transistors 22 corresponding to the four photodiodes 21 are disposed in pairs. Herein, the transfer transistor 22 is disposed between the two photodiodes 21 aligned in the vertical direction y. In addition, the floating diffusion FD is disposed between the two transfer transistors 22 disposed between the two photodiodes 21 aligned in the vertical direction y.

In addition, as illustrated in FIG. 5, in the unit pixel P, the four photodiodes 21 are configured so as to share a set of an amplification transistor 23, a selection transistor 24, and a reset transistor 25. In other words, with respect to the four photodiodes 21, one amplification transistor 23, one selection transistor 24, and one reset transistor 25 are disposed.

(b) Transistors

As illustrated in FIG. 4, in the unit pixel P, a transfer transistor 22, an amplification transistor 23, a selection transistor 24, and a reset transistor 25 are disposed on the imaging plane (xy plane). The transfer transistor 22, the amplification transistor 23, the selection transistor 24, and the reset transistor 25 are configured so that signal charges generated in the photodiode 21 are read out to be output as a data signal.

Each of the transfer transistor 22, the amplification transistor 23, the selection transistor 24, and the reset transistor 25 is configured with, for example, an N-channel MOS transistor.

Detailed Configurations of the transistors are sequentially described.

(b-1) Transfer Transistor

As illustrated in FIG. 4, in the unit pixel P, a plurality of the transfer transistors 22 are disposed in each of the horizontal direction x and the vertical direction y so as to correspond to a plurality of the imaging portions PA1, PA2, PB1, and PB2.

Herein, as illustrated in FIG. 4, the transfer transistors 22 are disposed so that the two transfer transistors 22 interpose the floating diffusion FD disposed between the plurality of the photodiodes 21 aligned in the vertical direction y on the imaging plane (xy plane).

As illustrated in FIG. 4, each transfer transistor 22 includes a transfer gate 22G, and the transfer gate 22G is disposed to extend in the horizontal direction x. In addition, the transfer gate 22G is disposed between the photodiodes 21 aligned in the vertical direction y in the unit pixel P.

As illustrated in FIG. 6, the transfer gates 22G are disposed on the front surface of the semiconductor substrate 101. Although not shown, a gate insulating film (not shown) is interposed between the transfer gate 22G and the front surface of the semiconductor substrate 101. In addition, the transfer gates 22G are disposed to be adjacent to the floating diffusions FD disposed on the surface layer of the semiconductor substrate 101 so that the two transfer gates 22G interpose one floating diffusion FD. The transfer gates 22G is formed with, for example, a conductive light-blocking material such as polysilicon.

As illustrated in FIG. 5, the transfer transistor 22 is configured so as to transfer the signal charges accumulated in the photodiode 21 as an output signal to the floating diffusion FD by applying a transfer signal from the transfer line 26 to the gate of the transfer transistor 22.

Herein, as illustrated in FIG. 5, the one terminal of the transfer transistor 22 is electrically connected to the cathode of the photodiode 21. In addition, the other terminal of the transfer transistor 22 is electrically connected to one floating diffusion FD.

In the embodiment, a pair of the transfer transistors 22 aligned in the vertical direction y are configured to transfer the signal charges to the floating diffusion FD. Therefore, the signal charges of a pair of the transfer transistors 22 aligned in the vertical direction y are added to the floating diffusion FD and output to the gate of the amplification transistor 23.

(b-2) Amplification Transistor

As illustrated in FIG. 4, in the unit pixel P, the amplification transistor 23 is disposed on the imaging plane (xy plane) under the plurality of the imaging portions PA1, PA2, PB1, and PB2. In other words, the amplification transistor 23 is disposed on the imaging plane (xy plane) under the plurality of the photodiodes 21 aligned in the horizontal direction x and the vertical direction y. Herein, the amplification transistor 23 is disposed so that a pair of the source and the drain interposes the channel in the horizontal direction.

As illustrated in FIG. 5, the amplification transistor 23 is configured to amplify and output the electrical signal output from the transfer transistor 22.

More specifically, as illustrated in FIG. 5, the gate of the amplification transistor 23 is connected to the floating diffusion FD. In addition, the drain of the amplification transistor 23 is connected to the power supply voltage Vdd, and the source thereof is connected through the selection transistor 24 to the vertical signal line 27. When the selection transistor 24 is selected so as to be in the on state, the amplification transistor 23 is supplied with a constant current from a constant current source I, so that the amplification transistor 23 operates as a source follower. Therefore, when a selection signal is supplied to the selection transistor 24, the output signal output from the floating diffusion FD is amplified by the amplification transistor 23.

(b-3) Selection Transistor

As illustrated in FIG. 4, in the unit pixel P, the selection transistor 24 is disposed on the imaging plane (xy plane) under the plurality of the imaging portions PA1, PA2, PB1, and PB2. In other words, similarly to the amplification transistor 23, the selection transistor 24 is disposed on the imaging plane (xy plane) under the plurality of the photodiodes 21 aligned in the horizontal direction x and the vertical direction y. Herein, the selection transistor 24 is disposed so that a pair of the source and the drain interposes the channel in the horizontal direction.

As illustrated in FIG. 5, the selection transistor 24 is configured so as to output the electrical signal output by the amplification transistor 23 to the vertical signal line 27 when the selection signal is input.

More specifically, as illustrated in FIG. 5, the gate of the selection transistor 24 is connected to the address line 28 supplied with the selection signal. When the selection signal is supplied, the selection transistor 24 is turned on to output the output signal, which is amplified by the amplification transistor 23 as described above, to the vertical signal line 27.

(b-4) Reset Transistor

As illustrated in FIG. 4, in the unit pixel P, the reset transistor 25 is disposed on the imaging plane (xy plane) under the plurality of the imaging portions PA1, PA2, PB1, and PB2. In other words, similarly to the amplification transistor 23 and the selection transistor 24, the reset transistor 25 is disposed on the imaging plane (xy plane) under the plurality of the photodiodes 21 aligned in the horizontal direction x and the vertical direction y. Herein, the reset transistor 25 is disposed so that a pair of the source and the drain interposes the channel in the horizontal direction.

As illustrated in FIG. 5, the reset transistor 25 is configured so as to reset the potential of the gate of the amplification transistor 23.

More specifically, as illustrated in FIG. 5, the gate of the reset transistor 25 is connected to the reset line 29 supplied with the reset signal. In addition, the drain of the reset transistor 25 is connected to the power supply voltage Vdd, and the source thereof is connected to the floating diffusion FD. In addition, when the reset signal is supplied from the reset line 29 to the gate, the reset transistor 25 resets the potential of the gate of the amplification transistor 23 to the power supply voltage Vdd through the floating diffusion FD.

(c) Wire-Line Layer 111

As illustrated in FIG. 6, the wire-line layer 111 is disposed on the front surface of the semiconductor substrate 101 where the transfer gates 22G of the transfer transistors 22 are disposed.

The wire-line layer 111 includes wire lines (not shown), and the wire lines in the insulating layer are formed so as to be electrically connected to elements. Herein, the wire lines are formed through lamination in the insulating layer so as to function as wire lines such as a transfer line 26, an address line 28, a vertical signal line 27, and a reset line 29 illustrated in FIG. 5.

More specifically, in the wire-line layer 111, in the boundary portion of the unit pixel P or in the boundary portion where the plurality of the imaging portions PA1, PA2, PB1, and PB2 constituting the unit pixel P are aligned, the wire lines are disposed.

(d) Color Filter CF

As illustrated in FIG. 6, the color filter CF is disposed at the side of the front surface of the semiconductor substrate 101 where the transfer gates 22G of the transfer transistors 22 are disposed.

Herein, as illustrated in FIG. 6, the color filter CF is disposed on the upper surface of the wire-line layer 111. In addition, the microlenses ML are disposed on the upper surface of the color filter CF.

As illustrated in FIG. 6, the color filter CF is configured so as to color the incident light according to the subject image to be transmitted through the light-receiving plane JS of the semiconductor substrate 101.

As illustrated in FIG. 3, the color filter CF includes a red filter layer CFR, a green filter layer CFG, and a blue filter layer CFB and is disposed in a Bayer array so as to correspond to each of the unit pixels P.

More specifically, in the color filter CF, the red filter layer CFR is configured to have high light transmittance with respect to the wavelength range (for example, a range of from 625 to 740 nm) corresponding to red and to color the incident light with red to be transmitted through the light-receiving plane. The red filter layer CFR is formed so that the plane structure thereof is a quadrangular shape.

In addition, in the color filter CF, the green filter layer CFG is configured to have high light transmittance with respect to the wavelength range (for example, a range of from 500 to 565 nm) corresponding to green and to color the incident light with green to be transmitted through the light-receiving plane. The green filter layer CFG is formed so that the plane structure thereof is a quadrangular shape.

In the color filter CF, the blue filter layer CFB is configured to have high light transmittance with respect to the wavelength range (for example, a range of from 450 to 485 nm) corresponding to blue and to color the incident light with blue to be transmitted through the light-receiving plane. The blue filter layer CFB is formed so that the plane structure thereof is a quadrangular shape.

In addition, as illustrated in FIG. 3, the color filter CF is configured so that the same color filter layers CFR, CFG, and CFB are disposed in the plurality of the imaging portions PA1, PA2, PB1, and PB2 constituting the unit pixel P. For example, as illustrated in FIG. 3, in the unit pixel P located at the left lower portion among the four unit pixels P, the red filter layer CFR is disposed in the plurality of the imaging portions PA1, PA2, PB1, and PB2 constituting the unit pixel P. As illustrated in FIG. 6, in the imaging portions PA1, PA2, PB1, and PB2, the red filter layer CFR are integrally formed.

For example, the color filter CF is formed by forming a coated layer by coating a coating solution including a coloring pigment and a photoresist resin according to a coating method such as a spin coating method, and after that, performing a pattern process on the coated layer according to a lithography technology.

(e) Microlens ML

As illustrated in FIG. 6, the microlenses ML are disposed at the side of the front surface of the semiconductor substrate 101 where the transfer gates 22G of the transfer transistors 22 are disposed.

Herein, as illustrated in FIG. 6, the microlenses ML are disposed on the upper surface of the color filter CF. A plurality of the microlenses ML are disposed so as to correspond to the plurality of the imaging portions PA1, PA2, PB1, and PB2 constituting the unit pixel P.

As illustrated in FIG. 6, the microlens ML is disposed above the light-receiving plane JS. The microlens ML is a convex lens of which the center is thicker than the edge and is configured to focus the incident light H to the light-receiving plane JS of the photodiode 21.

For example, the microlens ML is formed by using a transparent organic material such as a styrene resin, an acrylic resin, and a novolac resin. Besides, the microlens ML may be formed by using a transparent inorganic material such as $SiO_2$, SiN, SiON, SiCN, and HfO.

(f) Others

FIG. 7 is a conceptual diagram illustrating a potential in the unit pixel P according to the first embodiment of the invention. In FIG. 7, a potential in a portion taken along line VII-VII of FIG. 4 is illustrated.

As illustrated in FIG. 7, in the embodiment, similarly to the case illustrated in FIG. 19B, the electric field gradient in the photodiode 21 is formed to be increased so that the signal charges are moved to the side of the transfer transistor 22.

FIGS. 8A to 8C are timing charts illustrating pulse signals supplied to portions of the unit pixel P when a signal is read out from the unit pixel P according to the first embodiment of the invention. FIG. 8A illustrates a selection signal (SEL); FIG. 8B illustrates a reset signal (RST); and FIG. 8C illustrates transfer signals (TRF1 and TRF2) (refer to FIG. 5)

First, as illustrated in FIGS. 8A to 8C, at the first time point t1, the selection transistor 24 is set to a conduction state. In addition, at the second time point t2, the reset transistor 25 is set to a conduction state. Therefore, the potential of the gate of the amplification transistor 23 is reset.

Next, at the third time point t3, the reset transistor 25 is set to a non-conduction state. In addition, after that, the voltage corresponding to the reset level is read out as the output signal to the column circuit 14.

Next, at the fourth time point t4, the transfer transistor 22 is set to a conduction state, so that the signal charges accumulated in the photodiode 21 are transferred to the gate of the amplification transistor 23.

Next, at the fifth time point t5, the transfer transistor 22 is set to a non-conduction state. In addition, after that, the voltage corresponding to the signal level according to the amount of the accumulated signal charges is read out as the output signal to the column circuit 14.

In the column circuit 14, a differencing process is performed on the former-read reset level and the latter-read signal level, so that the signal is accumulated. Accordingly, fixed pattern noise generated according to the irregularity or the like of the Vth of each transistor disposed in each unit pixel P is cancelled.

Since the gates of the transistors 22, 24, and 25 are connected in units of a row constructed with the plurality of the unit pixels P aligned in the horizontal direction x, the aforementioned operation of driving the unit pixel P is simultaneously performed with respect to the plurality of the unit pixels P aligned in units of a row.

More specifically, the unit pixels P are sequentially selected in the vertical direction in units of a horizontal line (pixel row) according to the selection signal supplied by the aforementioned vertical driving circuit 13. In addition, the transistors of the unit pixels P are controlled according to various timing signals output from the timing generator 18. Therefore, the output signal of each of the unit pixels P is output to the column circuit 14 through the vertical signal line 27 in each column of the unit pixels P.

In addition, the signals accumulated in the column circuit 14 are selected by the horizontal driving circuit 15 to be sequentially output to the external output circuit 17.

In the embodiment, the signal charges generated by the plurality of the imaging portions PA1, PA2, PB1, and PB2 constituting the unit pixel P are added to be output as the output signal to the vertical signal line 27.

For example, as illustrated in FIGS. 8A to 8C, the signal charges of the photodiodes 21 disposed in the four imaging portions PA1, PA2, PB1, and PB2 are transferred through the transfer transistors 22 to the floating diffusion FD at the same timing. In addition, the voltage of the signal level according to the amount of the signal charges added in the floating diffusion FD is read out as the output signal.

In addition, the signal charges of the photodiodes 21 may be sequentially transferred to the floating diffusion FD at different timings, and the output signal may be driven so as to be read out based on the signal charges added in the floating diffusion FD.

(B) Method of Manufacturing Solid-State Imaging Device

Hereinafter, main processes of a method of manufacturing the aforementioned solid-state imaging device 1 are described.

Figure 9:
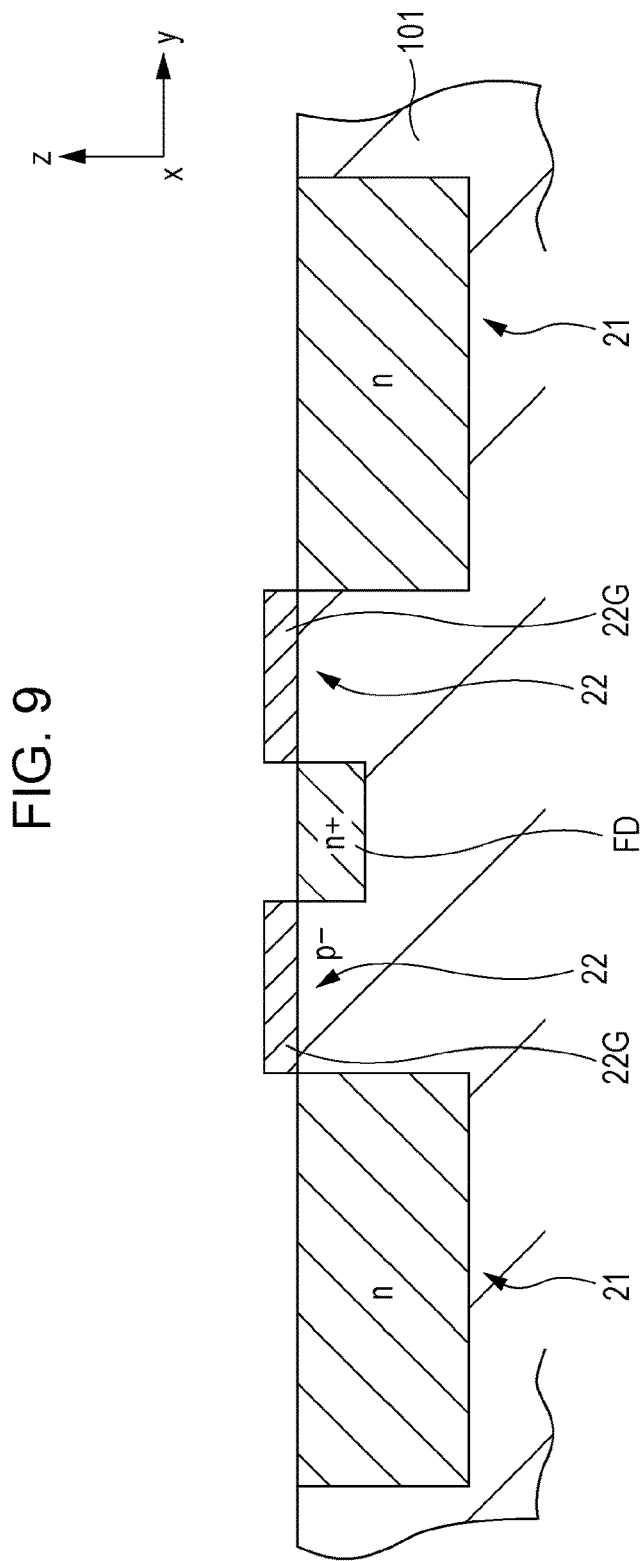
FIG. 9 is a diagram illustrating main components formed in processes of a method of manufacturing the solid-state imaging device according to the first embodiment of the invention.
Figure 10:
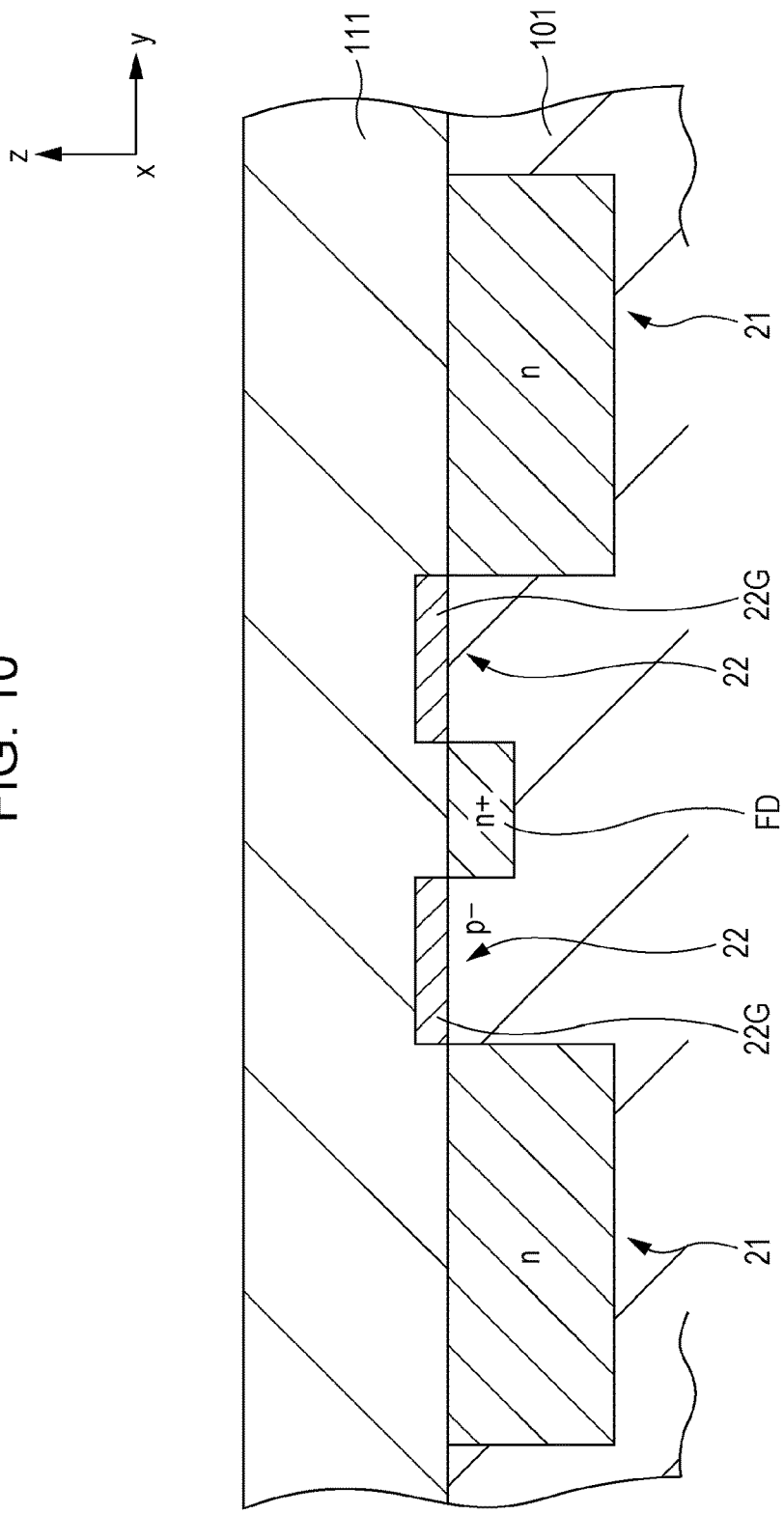
FIG. 10 is a diagram illustrating main components formed in processes of a method of manufacturing the solid-state imaging device according to the first embodiment of the invention.

FIGS. 9 and 10 are diagrams illustrating main components formed in processes of a method of manufacturing the solid-state imaging device 1 according to the first embodiment of the invention. Herein, FIGS. 9 and 10 illustrate a cross section of the imaging area PA similarly to FIG. 6.

(B-1) Formation of Photodiode 21, Transfer Transistor 22, and Floating Diffusion FD First, as illustrated in FIG. 9, the photodiode 21, the transfer transistor 22, and the floating diffusion FD are formed.

The photodiode 21 is formed by disposing an n-type charge accumulation area in a p well (not shown) disposed in the semiconductor substrate 101 which is an n-type silicon semiconductor. In addition, furthermore, a high-concentration p-type accumulation layer (not shown) is formed on the surface of the n-type charge accumulation area. More specifically, components constituting the photodiode 21 are disposed by appropriately injecting impurity ions into the semiconductor substrate 101.

The transfer transistor 22 is formed by forming a gate insulating film (not shown) on an upper surface of a channel formation area and, after that, by disposing a transfer gate 22G on an upper surface of the gate insulating film. More specifically, a silicon oxide film (not shown) is formed as the gate insulating film by performing a thermal oxidation process on the surface of the semiconductor substrate 101. In addition, for example, after a polysilicon film (not shown) is formed on the gate insulating film, a patterning process is performed on the polysilicon film (not shown), so that the transfer gate 22G is formed.

At the time of forming the transfer transistor 22, other transistors including the amplification transistor 23, the selection transistor 24, and the reset transistor 25 are formed in a similar manner.

The floating diffusion FD is formed by injecting n-type impurity ions into an upper layer of the semiconductor substrate 101. At the time of forming the floating diffusion FD, the source and drain regions of each transistor are also formed in a similar manner.

(B-2) Formation of Wire-Line Layer 111

Next, as illustrated in FIG. 10, the wire-line layer 111 is formed.

Herein, as illustrated in FIG. 10, in the semiconductor substrate 101, the wire-line layer 111 is disposed on the surface where the transfer gate 22G of the transfer transistor 22 is disposed.

For example, the wire-line layer 111 is disposed by forming an insulating layer by using an insulating material such as silicon oxide film and, at the same time, by forming a wire line (not shown) by using a metal material such as aluminum.

(B-3) Formation of Color Filter CF and Microlens ML

Next, as illustrated in FIG. 6, the color filter CF and the microlens ML are formed.

Herein, as illustrated in FIG. 6, the color filter CF is disposed on the surface where the wire-line layer 111 is coated in the semiconductor substrate 101. In addition, a microlens ML is disposed on the color filter CF.

In this manner, the components are disposed, so that the solid-state imaging device 1 is completed as a CMOS type image sensor.

(C) Conclusion

In this manner, in the solid-state imaging device 1 according to the embodiment, a plurality of the unit pixels P are disposed in the imaging area PA which captures a color image. A plurality of the unit pixels P are disposed in the imaging area PA in each of the horizontal direction x and the vertical direction y. The unit pixels P are disposed in a Bayer array in the imaging area PA so as to receive light of each of three primary colors. In other words, in the pixel array, the unit pixels P of red and the unit pixels P of green aligned in the vertical direction y to be adjacent to the unit pixels P of red are arrayed at the left side. In addition, the unit pixels P of green and the unit pixels P of blue aligned in the vertical direction y to be adjacent to the unit pixels P of green are arrayed at the right side (refer to FIG. 3).

A plurality of the photodiodes 21 (photoelectric conversion portions) are arrayed in each of the unit pixels P so as to receive light of the same color and generate the signal charges. In addition, a plurality of the transfer gates 22G which transfer the signal charges from the photodiodes 21 are formed by using a light blocking material for blocking light to be disposed in the plurality of the photodiodes 21. In addition, the signal charges from the plurality of the photodiodes 21 are configured so as to be transferred by the plurality of the transfer gates 22G to the floating diffusion FD to be added (refer to FIG. 4).

More specifically, in each of the unit pixels P, the photodiodes 21 are disposed in each of the imaging portions PA1 and PB1 (sub pixels) aligned in the horizontal direction x. In addition, the photodiodes 21 are disposed in each of the imaging portions PA2 and PB2 aligned in the vertical direction y of the imaging portions PA1 and PB1. In the unit pixel P, the photodiodes 21 are arrayed so that the same number of the photodiodes are aligned in each of the horizontal direction x and the vertical direction y (refer to FIG. 4).

In addition, in each of the unit pixels P, the transfer gates 22G which transfer the signal charges from the photodiodes 21 to the floating diffusion FD are disposed in the imaging portions PA1 and PB1 aligned in the horizontal direction x. In addition, the transfer gates 22G which transfer the signal charges from the photodiodes 21 to the floating diffusion FD are disposed in the imaging portions PA2 and PB2 aligned in the vertical direction y of the imaging portions PA1 and PB1 (refer to FIG. 4).

In the unit pixel P, the floating diffusions FD are disposed between the photodiodes 21 of the imaging portions PA1 and PB1 and the photodiodes 21 of the imaging portions PA2 and PB2 aligned in the vertical direction y. In addition, the floating diffusions FD are disposed between the transfer gates 22G of the imaging portions PA1 and PB1 and the transfer gates 22G of the imaging portions PA2 and PB2 aligned in the vertical direction y (refer to FIG. 4).

Therefore, in the solid-state imaging device according to the embodiment, it is possible to prevent the occurrence of the color shading, so that it is possible to improve the image quality of the color image.

Hereinafter, the aforementioned configurations will be described in detail.

Figure 11:
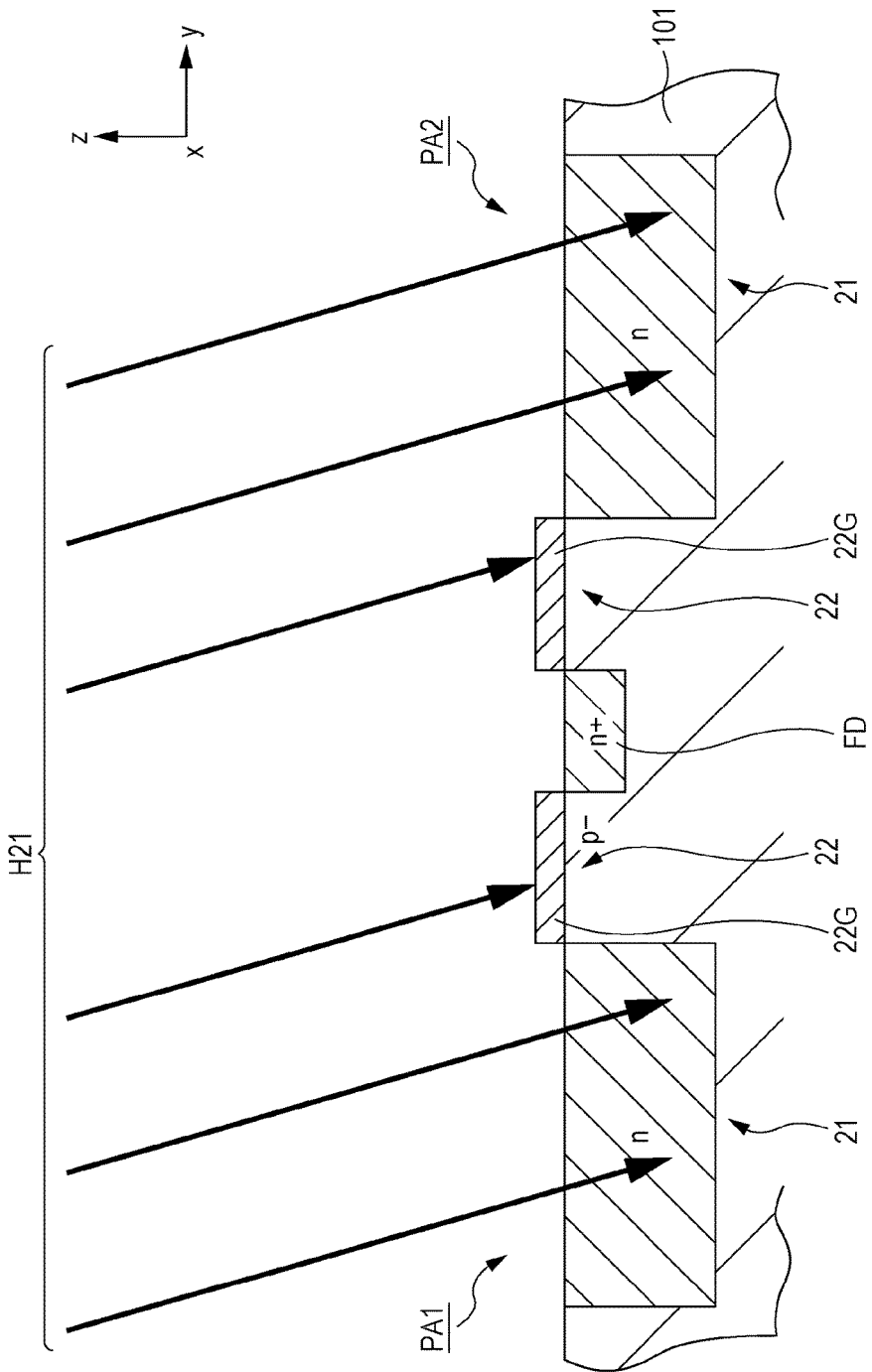
FIG. 11 is a diagram illustrating a behavior of incident light incident on the unit pixel according to the first embodiment of the invention.
Figure 12:
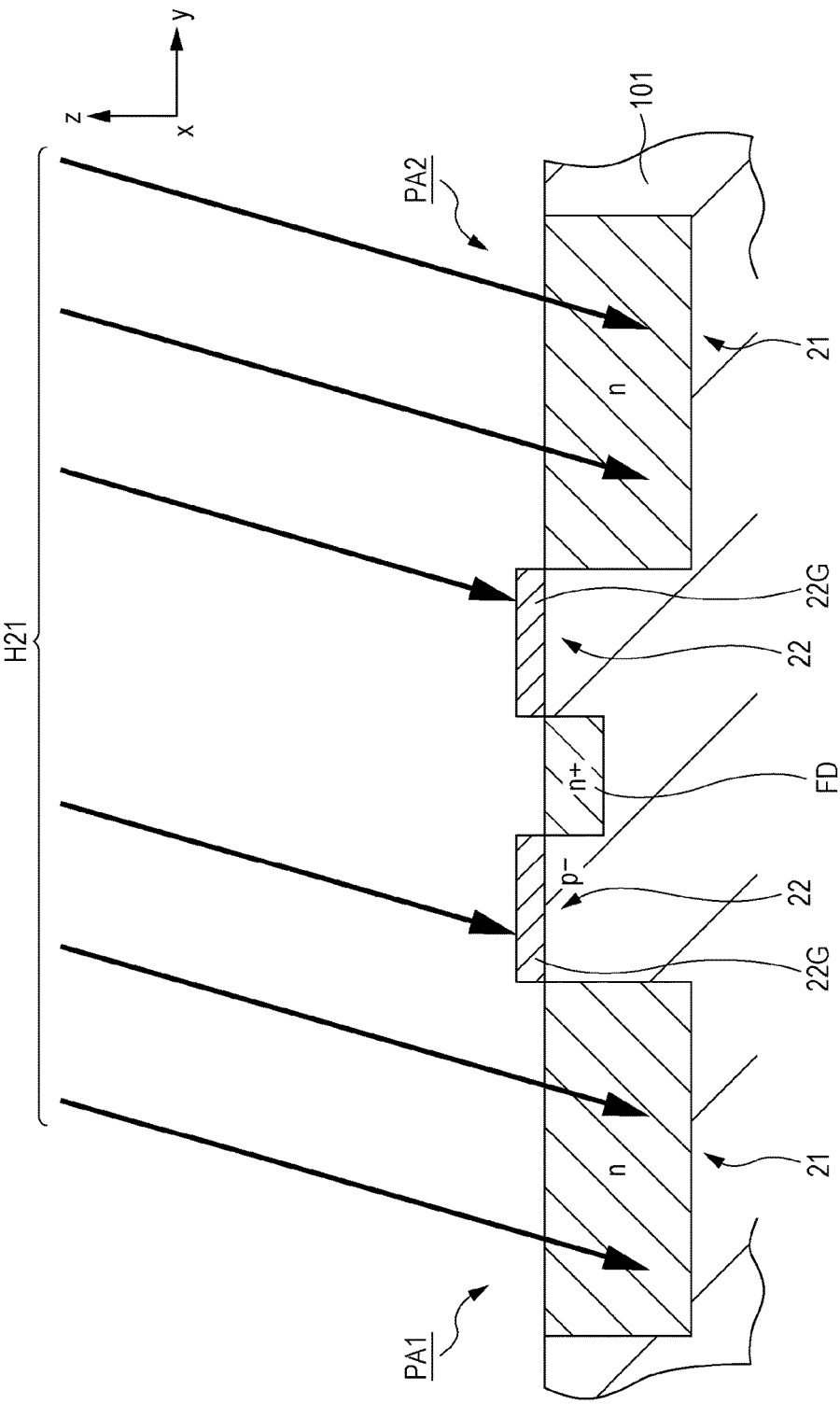
FIG. 12 is a diagram illustrating a behavior of incident light incident on the unit pixel according to the first embodiment of the invention.

FIGS. 11 and 12 are diagrams illustrating behaviors of incident light incident on the unit pixel P according to the first embodiment of the invention.

Herein, FIG. 11 illustrates a behavior of main light beams H21 incident on upper pixels PU located in the upper end portion of the imaging area PA where the plurality of the unit pixels P are disposed. In addition, FIG. 12 illustrates a behavior of main light beams H22 incident on lower pixels PL located in the lower end portion of the imaging area PA where the plurality of the unit pixels P are disposed (refer to FIG. 2). In addition, for simplifying the description, in FIGS. 11 and 12, the description of the wire-line layer 111 and the like is omitted.

As illustrated in FIGS. 11 and 12, the main light beams H21 and H22 are incident on the upper pixels PU or the lower pixels PL of the imaging area PA not in the direction z perpendicular to the imaging plane (xy plane) of the semiconductor substrate 101 but in the direction slanted with respect to the direction z (refer to FIGS. 1, 2, and the like)

Herein, as illustrated in FIG. 6, in the unit pixel P, since the red filter layer CFR (not shown in FIGS. 11 and 12) is disposed above each of the imaging portions PA1 and PA2, the main light beams H21 and H22 are incident as red light to the photodiodes 21.

Therefore, as illustrated in FIG. 11, in the imaging portion PA2 (the upper portion in FIG. 4) illustrated at the right side in the upper pixels PU located in the upper end portion of the imaging area PA, a portion of the main light beams H21 as red light is blocked by the transfer gates 22G before the main light beams H21 are incident on the photodiodes 21. On the other hand, in the imaging portion PA1 illustrated at the left side, the main light beams H21 as red light are not blocked by the transfer gates 22G before the main light beams H21 are incident on the photodiodes 21.

On the contrary, as illustrated in FIG. 12, in the imaging portion PA1 illustrated at the left side in the lower pixels PL located in the lower end portion of the imaging area PA, a portion of the main light beams H21 as red light is blocked by the transfer gates 22G before the main light beams H21 are incident on the photodiodes 21. On the other hand, in the imaging portion PA2 illustrated at the right side, the main light beams H21 as red light are not blocked by the transfer gates 22G before the main light beams H21 are incident on the photodiodes 21.

In this manner, the vignetting ratios of red light in the upper end portion and the lower end portion of the imaging area PA are the same. In other words, in the unit pixel P, the portions where the photodiodes 21, the transfer gates 22G, and the floating diffusions FD are disposed are formed so as to be symmetric with respect to the horizontal direction x and the vertical direction y as axes. Therefore, since the positions where the transfer gates 22G are disposed in the upper portion and the lower portion of the imaging area PA are symmetric with respect to the photodiode 21 which receive the red light, the vignetting ratios of the red light in the upper portion and the lower portion of the imaging area PA are the same.

Besides the red light, with respect to the blue light and the green light, similarly to the red light, the transfer gates 22G of the upper pixel PU and the lower pixel PL are disposed so that the vignetting ratios of the red light in the upper end portion and the lower end portion of the imaging area PA are the same.

Therefore, in the embodiment, as described above, it is possible to prevent the occurrence of the color shading, so that it is possible to improve the image quality of the color image.

Particularly, in the case where the solid-state imaging device is used in a small-sized electronic apparatus such as a capsule endoscope or a portable camera, as described above, the considerable color shading occurs. However, in the case according to the embodiment, it is possible to effectively prevent the occurrence of the problem.

In addition, in the embodiment, the unit pixel P is configured with a plurality of the imaging portions PA1, PA2, PB1, and PB2. Therefore, although the area of the unit pixel P is allowed to be enlarged, since the area of the individual photodiode 21 is small, the distance between the center of each photodiode 21 and the transfer transistor 22 may be shortened. Therefore, since it is possible to improve charge transfer efficiency, it is possible to suppress the occurrence of the afterimage.

In addition, in the embodiment, the unit pixel P includes microlenses ML which focus light to the photodiodes 21. In the unit pixel P, a plurality of the microlenses ML are disposed corresponding to a plurality of the photodiodes 21. Therefore, the incident light H is focused on the light-receiving plane of each of the photodiodes 21, so that the light receiving amount may be increased. Accordingly, it is possible to improve sensitivity.

In addition, in the embodiment, a plurality of the floating diffusions FD are disposed in the unit pixel P, and the plurality of the floating diffusions FD are electrically connected to each other by wire lines. Therefore, the efficiency of conversion of signal charges to a voltage in the floating diffusions FD may be decreased by adjusting FD wire line capacitance, so that it is possible to appropriately perform signal detection.

In general, the saturated signal amount of the solid-state imaging device is determined according to the number of the signal charges (the number of electrons or the number of holes) accumulated in the photodiode 21, a range of the floating diffusion FD, and a range of the latter-stage circuit (for example, an A/D converter).

Although the number of signal charges which may be accumulated in the photodiodes 21 is increased by increasing the size of the unit pixel, In the case of exceeding the range of the floating diffusion FD, signal detection is difficult. However, the signal detection may be performed by decreasing the conversion efficiency. In addition, since the number of the signal charges which may be accumulated in the photodiodes 21 may be increased, it is possible to prevent deterioration in image quality caused by light-shot noise.

Although the power consumption is increased in the case of increasing the range of the floating diffusion FD or the range of A/D converter by increasing the power supply voltage, it is unnecessary to increase the power supply voltage according to the aforementioned configuration, so that it is possible to reduce power consumption. In a small-sized electronic apparatus such as a capsule endoscope, no battery is provided therein, or a battery having a small capacity is provided, so that very low power consumption is necessary. Therefore, the aforementioned configuration is particularly suitable. In addition, since the thickness of the gate oxide film is necessarily increased according to an increase in the power supply voltage, the occurrence of noise may be increased. Therefore, it is unnecessary to increase the power supply voltage according to the aforementioned configuration, so that it is possible to decrease the occurrence of noise.

Therefore, in the embodiment, it is possible to improve characteristics such as image quality of the captured color image.

In addition, in the aforementioned embodiment, although the case where one amplification transistor 23 is disposed in the unit pixel P is described, the invention is not limited thereto. The plurality of the amplification transistors 23 may be disposed in the unit pixel P.

2. Second Embodiment (A) Configuration and the Like of Apparatus

Figure 13:
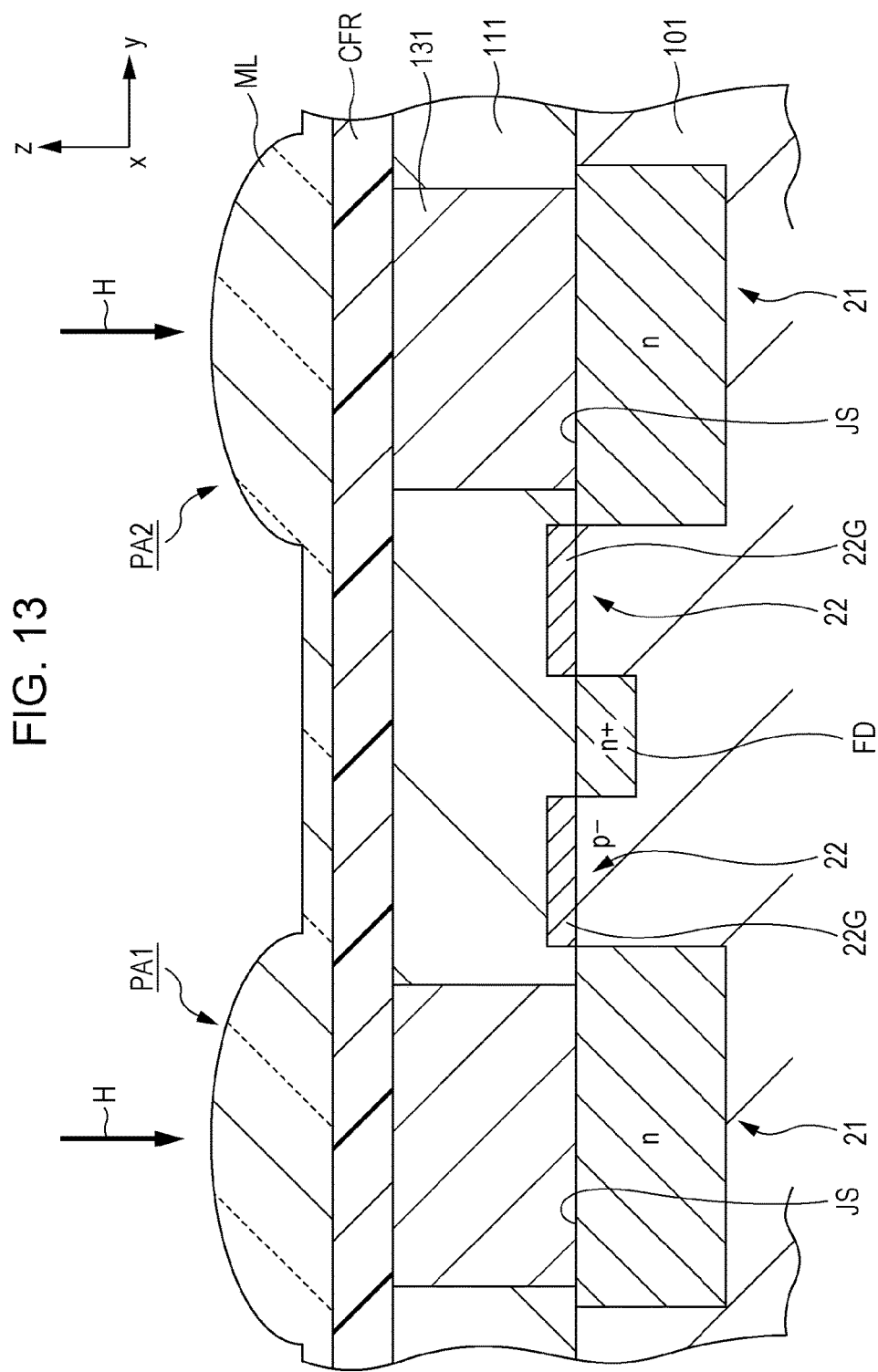
FIG. 13 is a diagram illustrating main components of a solid-state imaging device according to a second embodiment of the invention.

FIG. 13 is a diagram illustrating main components of a solid-state imaging device according to a second embodiment of the invention.

In addition, FIG. 13 illustrates a cross section of one unit pixel P similarly to FIG. 6. In other words, in FIG. 13, a cross section of a portion taken along line XIII-XIII of FIG. 4 is illustrated.

As illustrated in FIG. 13, in the embodiment, an optical waveguide 131 is disposed. Except for this point and the associated points, the embodiment is the same as the first embodiment. Therefore, with respect to the redundant portions, some description is omitted.

As illustrated in FIG. 13, the optical waveguide 131 is disposed at the side of the surface of the semiconductor substrate 101, on which the incident light H is incident.

As illustrated in FIG. 13, the optical waveguide 131 is formed to be interposed between the microlens ML and the light-receiving plane JS of the photodiode 21, so that the incident light H incident through the microlens ML is guided to the light-receiving plane JS of the photodiode 21.

More specifically, the optical waveguide 131 is a core portion of guiding light and is formed with an optical material of which the reflective index is higher than that of an insulating layer constituting a wire-line layer 111 in the periphery thereof. For example, the optical waveguide 131 which is the core portion is formed so as to totally reflect the incident light on the interface with respect to the clad portion.

(B) Conclusion

In this manner, in the embodiment, each unit pixel P includes the optical waveguide 131 which guides light to the photodiode 21. A plurality of the optical waveguides are disposed corresponding to the photodiodes 21 disposed in each of the imaging portions (PA1, PA2, and the like).

Therefore, the incident light H is guided to the light-receiving planes JS of the photodiodes 21 by the optical waveguides 131 with high efficiency, so that it is possible to increase the light receiving amount. Therefore, it is possible to improve sensitivity.

Therefore, in the embodiment, it is possible to further improve an image quality of a captured color image.

3. Third Embodiment (A) Configuration and the Like of Apparatus

Figure 14:
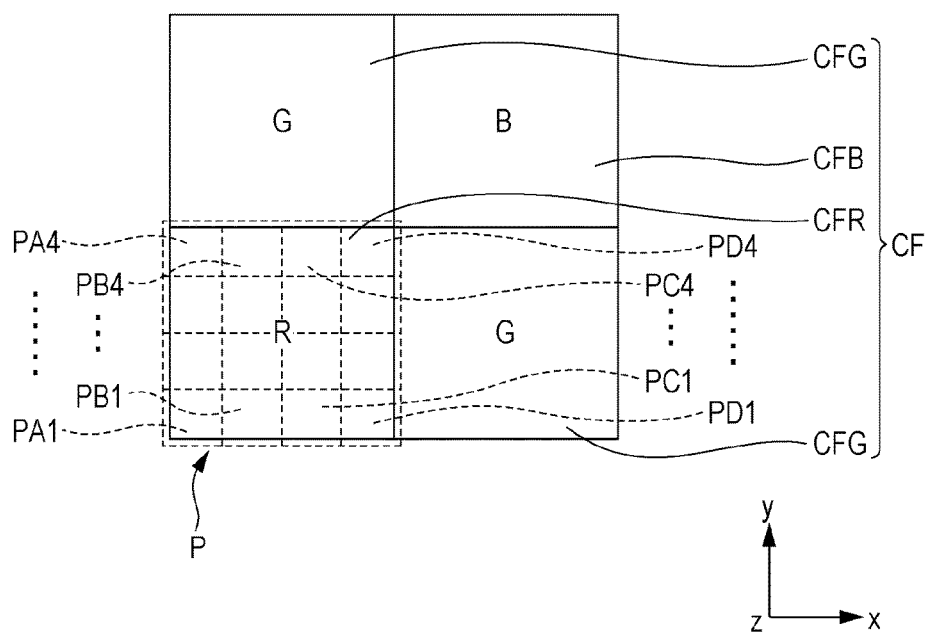
FIG. 14 is a diagram illustrating main components of a solid-state imaging device according to a third embodiment of the invention.
Figure 15:
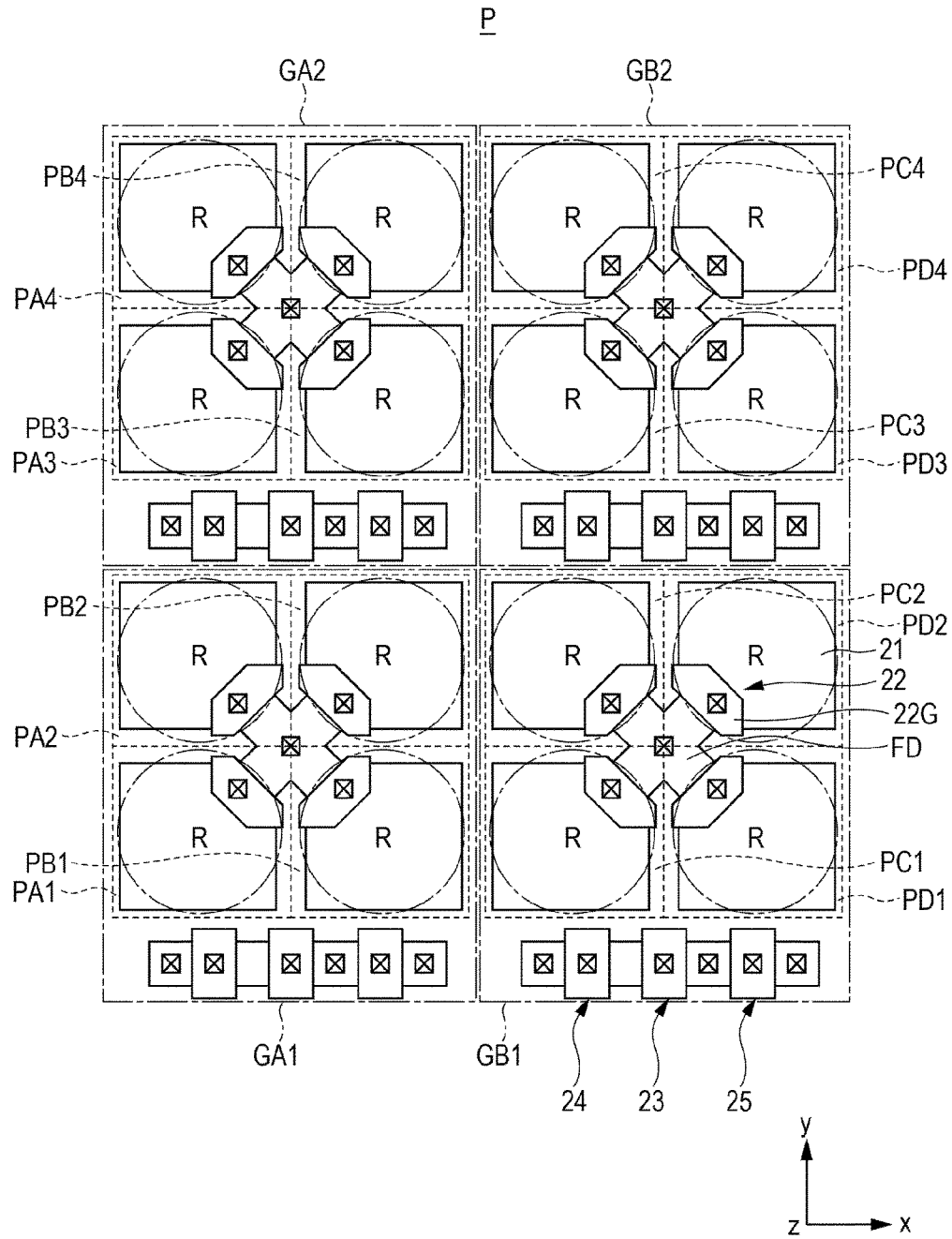
FIG. 15 is a diagram illustrating main components of the solid-state imaging device according to the third embodiment of the invention.
Figure 16:
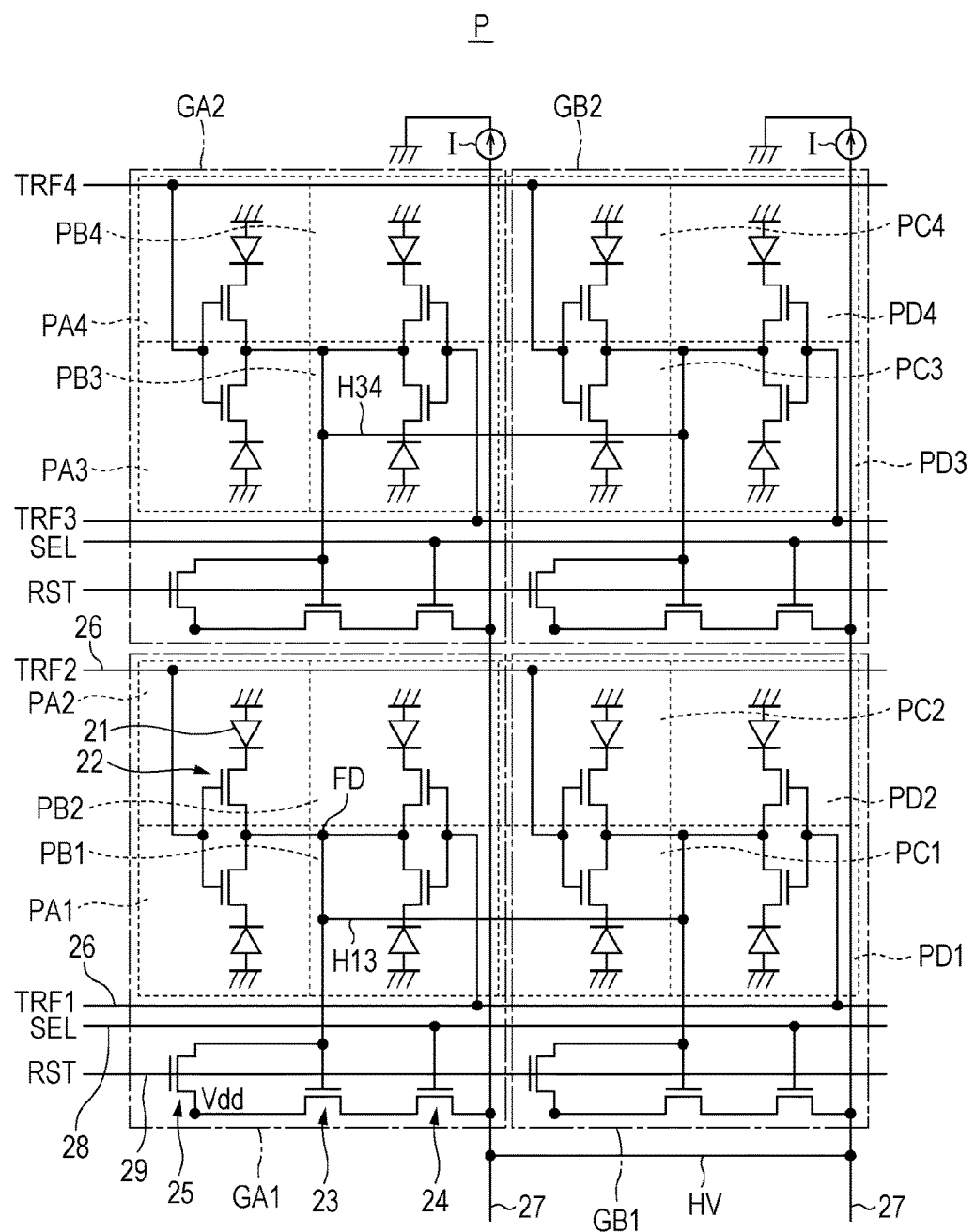
FIG. 16 is a diagram illustrating main components of the solid-state imaging device according to the third embodiment of the invention.

FIGS. 14 to 16 are diagrams illustrating main components of a solid-state imaging device according to a third embodiment of the invention.

Herein, FIG. 14 illustrates an upper surface of an imaging area PA where a plurality of unit pixels P are arrayed in a solid-state imaging device similarly to FIG. 3.

In addition, FIG. 15 illustrates an upper surface of one unit pixel P similarly to FIG. 4. In other words, in FIG. 15, an upper surface of the unit pixel P (red pixel) where the red filter layer CFR in FIG. 14 is disposed is exemplarily illustrated. In addition, the unit pixel P (green pixel) where the green filter layer CFG in FIG. 14 is disposed and the unit pixel P (blue pixel) where the blue filter layer CFB is disposed also have the same configuration as the unit pixel P (red pixel) where the red filter layer CFR is disposed.

In addition, FIG. 16 illustrates a circuit configuration of one unit pixel P similarly to FIG. 5. In FIG. 16, similarly to FIG. 15, a circuit configuration of the unit pixel P (red pixel) where the red filter layer CFR in FIG. 14 is disposed is exemplarily illustrated. In addition, the green pixel and the blue pixel also have the same circuit configuration as that of the red pixel.

As illustrated in FIGS. 14 to 16, in the embodiment, the number of the imaging portions PA1 to PA4, PB1 to PB4, PC1 to PC4, and PD1 to PD4 constituting the unit pixel P is different from that of the first embodiment. Besides, the configuration of the unit pixel P is different. Except for this point and the associated points, the embodiment is the same as the first embodiment. Therefore, with respect to the redundant portions, some description is omitted.

(A-1) Array of Unit Pixels

As illustrated in FIG. 14, similarly to the first embodiment, in the solid-state imaging device, a color filter CF is disposed in each of the unit pixels P. The color filter CF includes a red filter layer CFR, a green filter layer CFG, and a blue filter layer CFB and is disposed in a Bayer array in each of the unit pixels P.

As illustrated in FIG. 14, each of the unit pixels P is configured to include a plurality of the imaging portions PA1 to PA4, PB1 to PB4, PC1 to PC4, and PD1 to PD4. In the embodiment, a total of 16 imaging portions PA1 to PA4, PB1 to PB4, PC1 to PC4, and PD1 to PD4 are included in the unit pixel P.

(A-2) Each Unit Pixel

As illustrated in FIGS. 15 and 16, in the unit pixel P, the imaging portions PA1 to PA4, PB1 to PB4, PC1 to PC4, and PD1 to PD4 are arrayed in the imaging plane (xy plane) so as to be aligned in units of four in each of the horizontal direction x and the vertical direction y.

In the unit pixel P, two imaging portions are aligned in each of the horizontal direction x and the vertical direction y, so that the groups GA1, GA2, GB1, and GB2 including a total of the four imaging portions (PA1, PA2, PB1, PB2, or the like) are repetitively arrayed in the horizontal direction x and the vertical direction y.

As illustrated in FIGS. 15 and 16, similarly to the first embodiment, among the groups GA1, GA2, GB1, and GB2, in each of the imaging portions PA1 to PA4, PB1 to PB4, PC1 to PC4, and PD1 to PD4, a photodiode 21 and a transfer transistor 22 are disposed. In addition, in each of the groups GA1, GA2, GB1, and GB2, under the set constructed with the four imaging portions (PA1, PA2, PB1, PB2, and the like), a transistor group constructed as a set of an amplification transistor 23, a reset transistor 25, and a selection transistor 24 is disposed. In other words, the unit pixel P is disposed to include the four groups GA1, GA2, GB1, and GB2 which share the transistor group constructed as a set of the four imaging portions (PA1, PA2, PB1, and PB2).

However, as illustrated in FIG. 15, in the unit pixel P, a portion of the groups GA1, GA2, GB1, and GB2 including the four imaging portions (PA1, PA2, PB1, PB2, and the like) is configured to be different from the unit pixel P according to the first embodiment (refer to FIG. 4).

More specifically, in each of the groups GA1, GA2, GB1, and GB2, the position of the floating diffusion FD is different from that in the unit pixel P according to the first embodiment. In addition, the positions of the transfer gates 22G are different. Except for this point and the associated points, each of the groups GA1, GA2, GB1, and GB2 according the embodiment is the same as the unit pixel P according to the first embodiment.

As illustrated in FIG. 15, in each of the groups GA1, GA2, GB1, and GB2, a plurality of the floating diffusions FD are not disposed, but one floating diffusion FD is disposed. The one floating diffusions FD are disposed to be located between all the four photodiodes 21 disposed in the imaging portions (PA1, PA2, PB1, PB2, and the like). In other words, the floating diffusions FD are disposed between the plurality of the imaging portions (a set of PA1 and PB2, a set of PA2 and PB1, or the like) aligned in the vertical direction y, the horizontal direction x, and the direction slanted with respect to the vertical direction y and the horizontal direction x.

As illustrated in FIG. 15, a plurality of the transfer gates 22G are disposed in each of the groups GA1, GA2, GB1, and GB2. The transfer gates 22G are disposed so that the floating diffusions FD are interposed between the four transfer gates 22G disposed in the imaging portions (PA1, PA2, PB1, PB2, and the like). In other words, the transfer gates 22G are disposed so as to be aligned through the floating diffusions FD between the plurality of the imaging portions (a set of PA1 and PB2, a set of PA2 and PB1, or the like) aligned in the vertical direction y, the horizontal direction x, and the direction slanted with respect to the vertical direction y and the horizontal direction x.

As illustrated in FIG. 16, in the unit pixel P, the groups GA1, GA2, GB1, and GB2 including the four imaging portions (PA1, PA2, PB1, PB2, and the like) are electrically connected to each other and are disposed so as to add the signals from the imaging portions and to output the added signal.

More specifically, as illustrated in FIG. 16, in the unit pixel P, a plurality of vertical signal lines 27 are disposed, and each of the vertical signal lines 27 electrically connects the groups (a set OF GA1 and GA2 or a set of GB1 and GB2) aligned in the vertical direction y.

In addition, the groups (a set of GA1 and GB1 or a set of GA2 and GB2) aligned in the horizontal direction x are electrically connected to each other by the wire lines H34 and H13. Herein, in each of the groups GA1, GA2, GB1, and GB2, the wire lines H34 and H13 are disposed so as to electrically connect wire lines which electrically connect the floating diffusions FD and the gate of the amplification transistor 23.

In addition, furthermore, a wire line HV is disposed so that the two vertical signal lines 27 are electrically connected to each other at the output end portions of outputting the electrical signal from the unit pixel P.

In the embodiment, the signal charges generated by the plurality of the imaging portions PA1 to PA4, PB1 to PB4, PC1 to PC4, and PD1 to PD4 constituting the unit pixel P are added to be output as an output signal to each of the vertical signal lines 27. After that, the signal output from each of the vertical signal lines 27 is smoothed by a smoothing circuit (not shown) of the following stage.

(B) Conclusion

In this manner, similarly to the first embodiment, in the embodiment, in the unit pixel P, the portions where the photodiodes 21, the transfer gates 22G, and the floating diffusions FD are disposed are symmetric with respect to the horizontal direction x and the vertical direction y as axes. Therefore, similarly to the first embodiment, vignetting ratios of each color light in the upper portion and the lower portion of the imaging area PA become the same, so that it is possible to prevent the occurrence of the color shading. Besides, similarly to the first embodiment, it is possible to effectively prevent the occurrence of the afterimage or the like.

In addition, in the embodiment, in the unit pixel P, a plurality of the amplification transistors 23 are disposed, and a plurality of the vertical signal lines 27 are disposed. In addition, in the unit pixel P, the plurality of the vertical signal lines 27 is electrically connected to each other. Therefore, as described above, the signals output from the plurality of the vertical signal lines 27 are smoothed, so that it is possible to reduce random noise.

Therefore, in the embodiment, it is possible to improve an image quality of a captured color image.

4. Fourth Embodiment (A) Configuration of Apparatus

Figure 17:
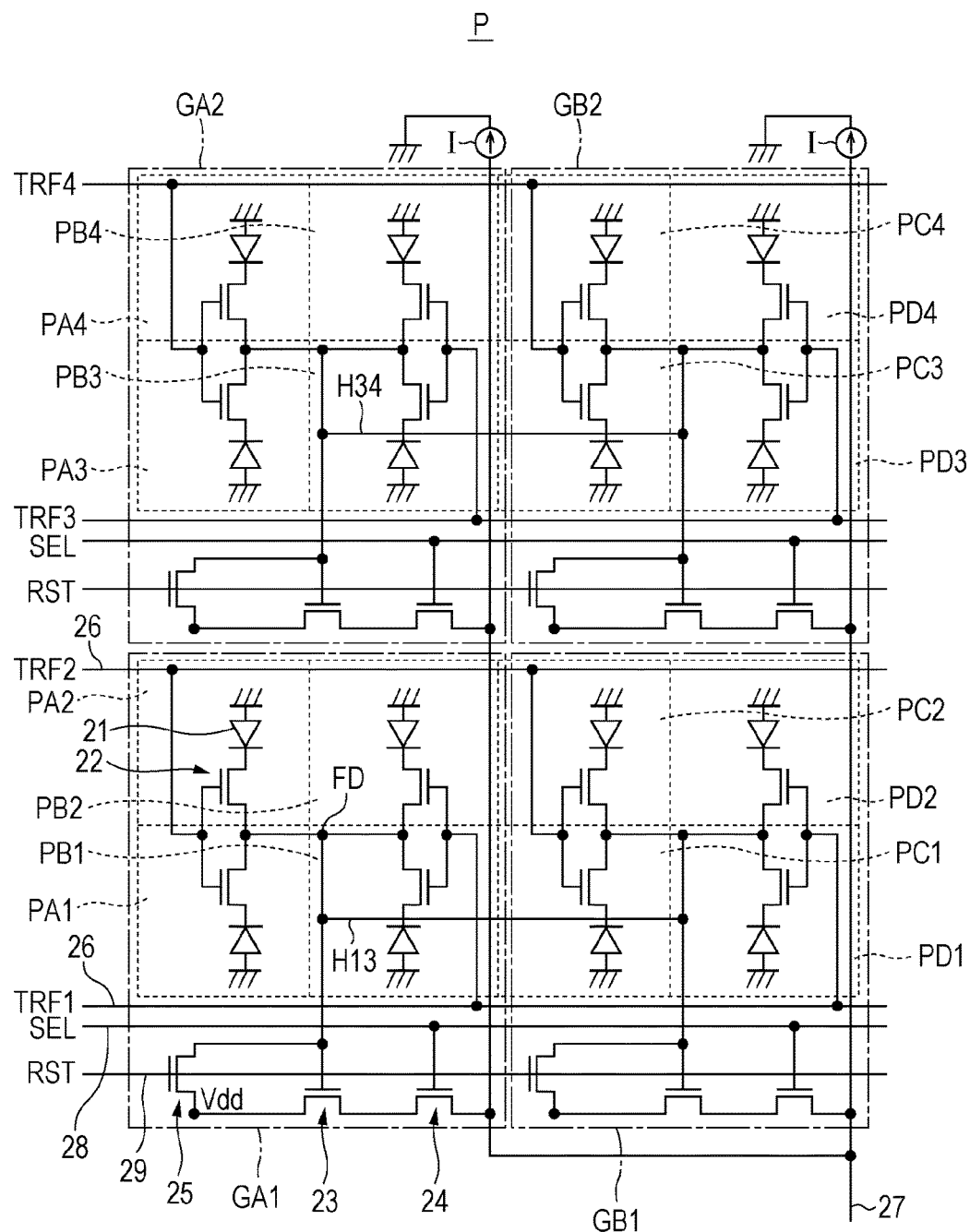
FIG. 17 is a diagram illustrating main components of a solid-state imaging device according to a fourth embodiment of the invention.
Figure 18:
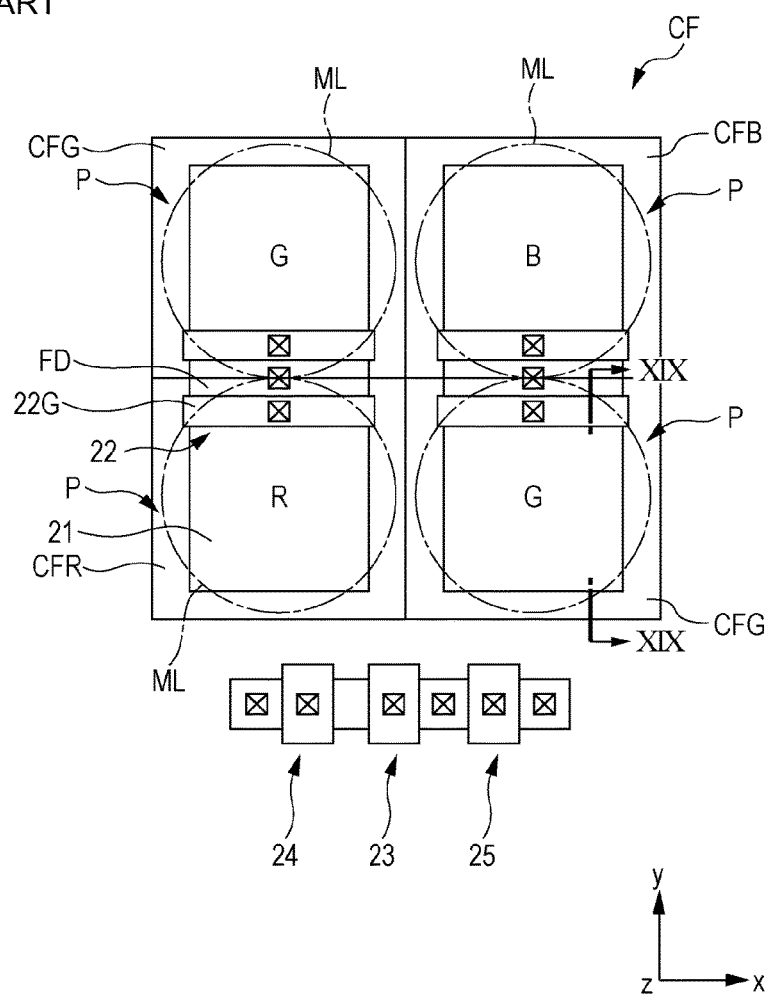
FIG. 18 is a diagram illustrating an array of unit pixels in a CMOS type image sensor.
Figure 20:
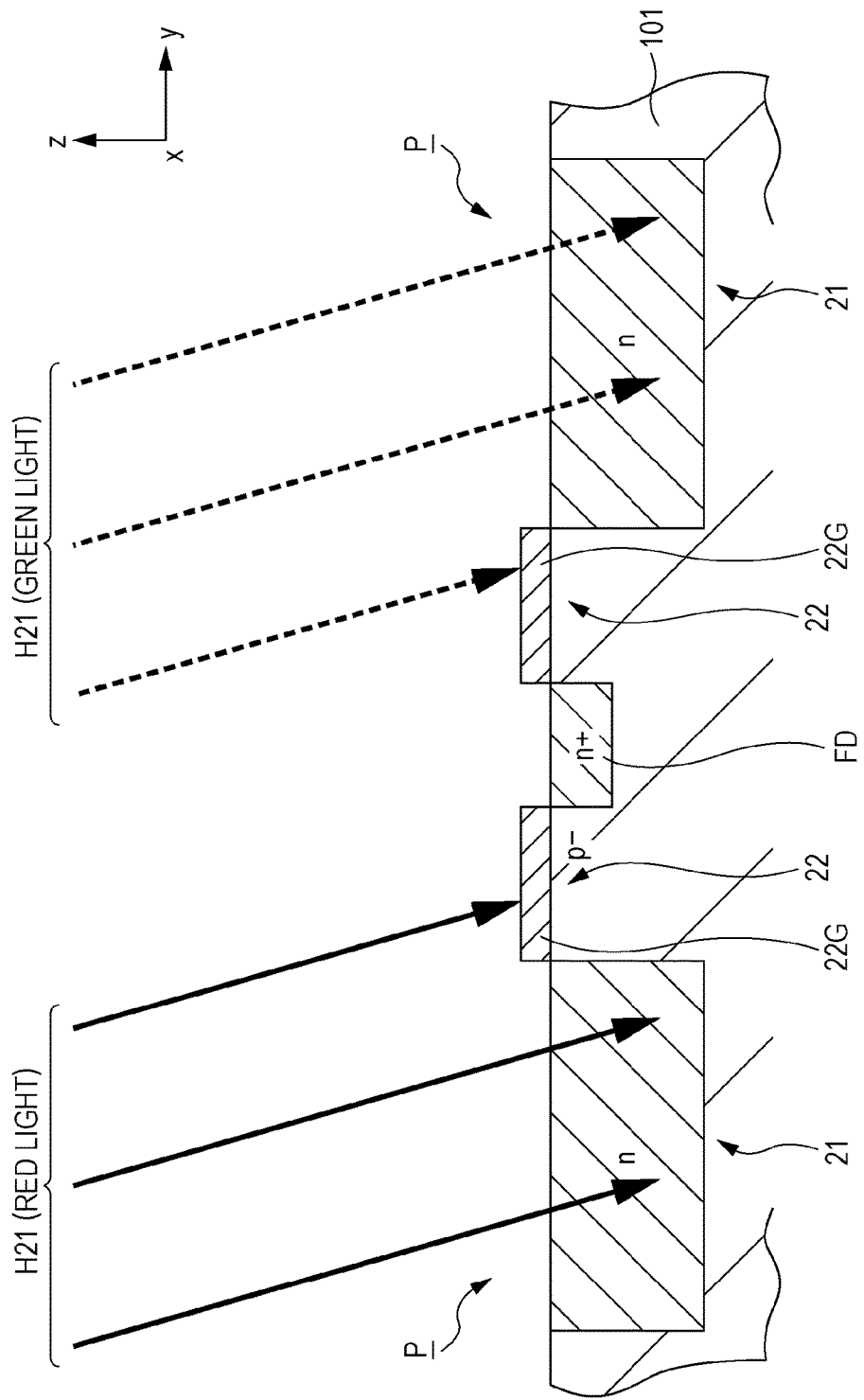
FIG. 20 is a diagram illustrating a behavior of incident light incident on the unit pixel of the CMOS type image sensor.
Figure 21:
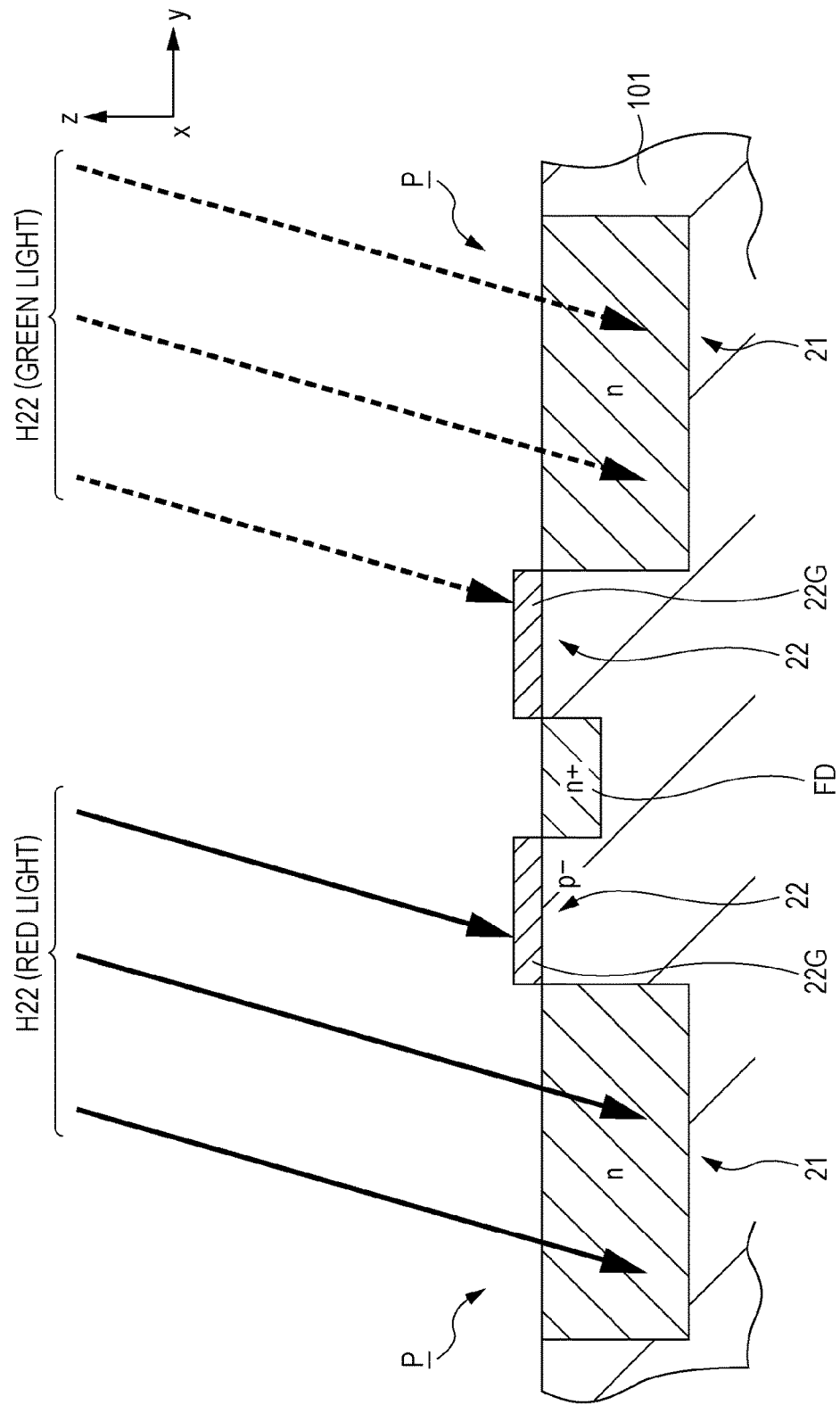
FIG. 21 is a diagram illustrating a behavior of incident light incident on the unit pixel of the CMOS type image sensor.

FIG. 17 is a diagram illustrating main components of a solid-state imaging device according to a fourth embodiment of the invention.

Herein, FIG. 17 illustrates a circuit configuration of one unit pixel P similarly to FIG. 16. In FIG. 17, similarly to FIG. 16, a circuit configuration of the unit pixel P (red pixel) where the red filter layer CFR in FIG. 14 is disposed is exemplarily illustrated. In addition, the green pixel and the blue pixel also have the same circuit configuration as the red pixel.

As illustrated in FIG. 17, in the embodiment, the vertical signal line 27 constituting the unit pixel P is different from that of the third embodiment. Except for this point and the associated points, the embodiment is the same as the third embodiment. Therefore, with respect to the redundant portions, some description is omitted.

As illustrated in FIG. 17, the groups GA1, GA2, GB1, and GB2 including the four imaging portions (PA1, PA2, PB1, PB2, and the like) are disposed so that the groups GA1, GA2, GB1, and GB2 are electrically connected to each other so as to add the signals from the imaging portions and to output the added signal.

More specifically, as illustrated in FIG. 17, in the unit pixel P, one vertical signal line 27 which output the electrical signal from the unit pixel P is disposed, and the four groups GA1, GA2, GB1, and GB2 are electrically connected to the one vertical signal line 27. In other words, in the unit pixel P, a plurality of the amplification transistors 23 are disposed in each of the groups GA1, GA2, GB1, and GB2, and the sources of the amplification transistors 23 are electrically connected to a common vertical signal line 27.

Therefore, in the embodiment, the signal charges generated by the plurality of the imaging portions PA1 to PA4, PB1 to PB4, PC1 to PC4, and PD1 to PD4 constituting the unit pixel P are added to be output as an output signal to the common vertical signal line 27.

(B) Conclusion

In this manner, similarly to the third embodiment, in the embodiment, in the unit pixel P, the portions where the photodiodes 21, the transfer gates 22G, and the floating diffusions FD are disposed are symmetric with respect to the horizontal direction x and the vertical direction y as axes. Therefore, similarly to the third embodiment, vignetting ratios of each color light in the upper portion and the lower portion of the imaging area PA become the same, so that it is possible to prevent the occurrence of the color shading. Besides, similarly to the first embodiment, it is possible to effectively prevent the occurrence of the afterimage or the like.

In addition, in the embodiment, the plurality of the amplification transistors 23 are disposed in the unit pixel P, and the sources of the plurality of the amplification transistors 23 are electrically connected to a common vertical signal line 27.

Therefore, in the embodiment, it is possible to improve the image quality of the captured color image.

5. Others

When the invention is embodied, the invention is not limited to the aforementioned embodiments, but various modified examples may be employed.

For example, in the aforementioned embodiments, although the case where the invention is adapted to a camera is described, the invention is not limited thereto. The invention may be adapted to other electronic apparatuses having a solid-state imaging device such as scanners or copiers.

In the aforementioned embodiments, although the case where four or sixteen photodiodes are disposed in the unit pixel P is described, the invention is not limited thereto. An appropriate number of the photodiodes may be disposed in the unit pixel P.

In addition, although the pixel transistor including four types of transistors, that is, the transfer transistor, the amplification transistor, the selection transistor, and the reset transistor are disclosed, the invention is not limited thereto.

In addition, in the aforementioned embodiment, the solid-state imaging device 1 corresponds to a solid-state imaging device according to the invention. In addition, in the aforementioned embodiment, the unit pixel P corresponds to a unit pixel according to the invention. In addition, in the aforementioned embodiment, the imaging area PA corresponds to an imaging area according to the invention. In addition, in the aforementioned embodiment, the photodiode 21 corresponds to a photoelectric conversion portion according to the invention. In addition, in the aforementioned embodiment, the transfer gate 22G corresponds to a transfer gate according to the invention. In addition, in the aforementioned embodiment, the floating diffusion FD corresponds to a floating diffusion according to the invention. In addition, in the aforementioned embodiment, the amplification transistor 23 corresponds to an amplification transistor according to the invention. In addition, in the aforementioned embodiment, the vertical signal line 27 corresponds to a vertical signal line according to the invention. In addition, in the aforementioned embodiment, the microlens ML corresponds to a microlens according to the invention. In addition, in the aforementioned embodiment, the optical waveguide 131 corresponds to an optical waveguide according to the invention. In addition, in the aforementioned embodiment, the camera 40 corresponds to an electronic apparatus according to the invention.

The present application contains subject matter related to that disclosed in Japanese Priority Patent Application JP 2010-107265 filed in the Japan Patent Office on May 7, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising a plurality of unit pixels, wherein each unit pixel comprises:
   a first photoelectric conversion region;
   a transfer transistor coupled to the first photoelectric conversion region;
   a first floating diffusion coupled to the first transfer transistor;
   a second photoelectric conversion region;
   a second transfer transistor coupled to the second photoelectric conversion region;
   a second floating diffusion coupled to the second transfer transistor;
   a wiring coupled to the first floating diffusion and the second floating diffusion;
   a first amplification transistor with a first gate coupled to the wiring; and
   a second amplification transistor with a second gate coupled to the wiring.

2. The imaging device according to claim 1, wherein the first photoelectric conversion region and the second photoelectric conversion region are configured to receive light filtered to a first spectrum.

3. The imaging device according to claim 1, wherein each unit pixel further comprises a first color filter disposed above the first photoelectric conversion region and the second photoelectric conversion region.

4. The imaging device according to claim 3, wherein the first photoelectric conversion region and the second photoelectric conversion region are configured to receive light transmitted through the first color filter.

5. The imaging device according to claim 3, wherein the first color filter bandpasses red light.

6. The imaging device according to claim 3, wherein the first color filter bandpasses green light.

7. The imaging device according to claim 3, wherein the first color filter bandpasses blue light.

8. The imaging device according to claim 1, wherein each unit pixel further comprises a first micro lens disposed above the first photoelectric conversion region and a second micro lens disposed above the second photoelectric conversion region.

9. The imaging device according to claim 8, wherein the first micro lens is configured to focus incident light on the first photoelectric conversion region and the second micro lens is configured to focus incident light on the second photoelectric conversion region.

10. The imaging device according to claim 1, wherein the first photoelectric conversion region and the second photoelectric conversion region are disposed in a first line along a first direction and the first amplification transistor and the second amplification transistor are disposed in a second line along the first direction.

11. The imaging device according to claim 1, wherein the first transfer transistor is coupled to a first input signal line and the second transfer transistor is coupled to a second input signal line different from the first input signal line.

12. The imaging device according to claim 1, wherein each unit pixel further comprises:
   a first selection transistor coupled to the first amplification transistor; and
   a second selection transistor coupled to the second amplification transistor.

13. The imaging device according to claim 12, further comprising a first signal line coupled to the first selection transistor and the second selection transistor.

14. The imaging device according to claim 12, further comprising a first signal line coupled to the first selection transistor and a second signal line coupled to the second selection transistor.

15. The imaging device according to claim 12, wherein the first amplification transistor, the second amplification transistor, the first selection transistor, and the second selection transistor are disposed in a first line.

16. The imaging device according to claim 15, wherein the first amplification transistor is disposed between the first selection transistor and the second selection transistor.

17. The imaging device according to claim 16, wherein the second amplification transistor is disposed adjacent to the second selection transistor.

18. The imaging device according to claim 12, wherein each unit pixel further comprises a first reset transistor, the first amplification transistor, the first selection transistor, and the first reset transistor being disposed in a first line.

19. The imaging device according to claim 18, wherein the first amplification transistor is disposed between the first selection transistor and the first reset transistor.

20. An electronic apparatus, comprising:
   an imaging device according to claim 1;
   an optical system;
   a signal processing circuit; and
   a controller.

21. The imaging device according to claim 1, wherein the first floating diffusion and the second floating diffusion are disposed in a semiconductor substrate.

* * * * *